US012751182B2

(12) United States Patent
Zhong et al.

(10) Patent No.: US 12,751,182 B2
(45) Date of Patent: Sep. 29, 2026

(54) DISPLAY PANEL, PREPARATION METHOD THEREFOR, AND DISPLAY DEVICE

(71) Applicant: Xiamen Tianma Display Technology Co., Ltd., Xiamen (CN)

(72) Inventors: Jiansheng Zhong, Xiamen (CN); Jinjin Yang, Xiamen (CN); Shui He, Xiamen (CN)

(73) Assignee: Xiamen Tianma Display Technology Co., Ltd., Xiamen (CN)

( * ) Notice: Subject to any disclaimer, the term of this patent is extended or adjusted under 35 U.S.C. 154(b) by 347 days.

(21) Appl. No.: 18/623,571

(22) Filed: Apr. 1, 2024

(65) Prior Publication Data

US 2024/0244931 A1 Jul. 18, 2024

(30) Foreign Application Priority Data

Dec. 15, 2023 (CN) ......................... 202311749215.9

(51) Int. Cl.

| | |
|---|---|
| ***H10K 59/12*** | (2023.01) |
| ***H10K 59/80*** | (2023.01) |
| *H10K 102/00* | (2023.01) |

(52) U.S. Cl.

CPC ....... *H10K 59/873* (2023.02); *H10K 59/1201* (2023.02); *H10K 59/80521* (2023.02); *H10K 2102/351* (2023.02)

(58) Field of Classification Search

CPC ............ H10K 59/873; H10K 59/1201; H10K 59/80521; H10K 2102/351

USPC ........................................................... 257/40

See application file for complete search history.

(56) References Cited

U.S. PATENT DOCUMENTS

2023/0422577 A1 * 12/2023 Seo ........................ H05B 33/28

FOREIGN PATENT DOCUMENTS

| | | | | |
|---|---|---|---|---|
| CN | 106783926 A | * | 5/2017 | H10K 50/84 |
| CN | 110265583 A | * | 9/2019 | H10K 59/353 |
| CN | 111162194 A | * | 5/2020 | H10K 59/1201 |
| WO | WO-2023000295 A1 | * | 1/2023 | H10K 71/70 |

* cited by examiner

*Primary Examiner* — Phuc T Dang

(74) *Attorney, Agent, or Firm* — KDW Firm PLLC

(57) ABSTRACT

A display panel includes a partition retaining wall, the partition retaining wall includes a metal partition portion and an insulating retaining wall portion, a sidewall on one side of the metal partition portion facing away from the insulating retaining wall portion includes a first recess structure, and the cathode layer is separated at the first recess structure.

20 Claims, 11 Drawing Sheets

S11: Prepare a partition retaining wall on one side of a base subtract in an isolating region, where the partition retaining wall includes a metal partition portion and an insulating retaining wall portion; in a direction in which a display region points to an aperture region, a sidewall on one side of the metal partition portion facing away from the insulating retaining wall portion includes a first recess structure, and the first recess structure is recessed towards one side of the insulating retaining wall portion; the metal partition portion includes a first metal partition portion and a second metal partition portion; in the direction in which the display region points to the aperture region, the insulating retaining wall portion is located between the first metal partition portion and the second metal partition portion, and the first metal partition portion and the second metal partition portion are insulated from each other

↓

S12: Prepare a cathode layer on one side of the partition retaining wall facing away from the base substrate, where the cathode layer extends from the display region to the isolating region, and the cathode layer is separated at the first recess structure

FIG. 11

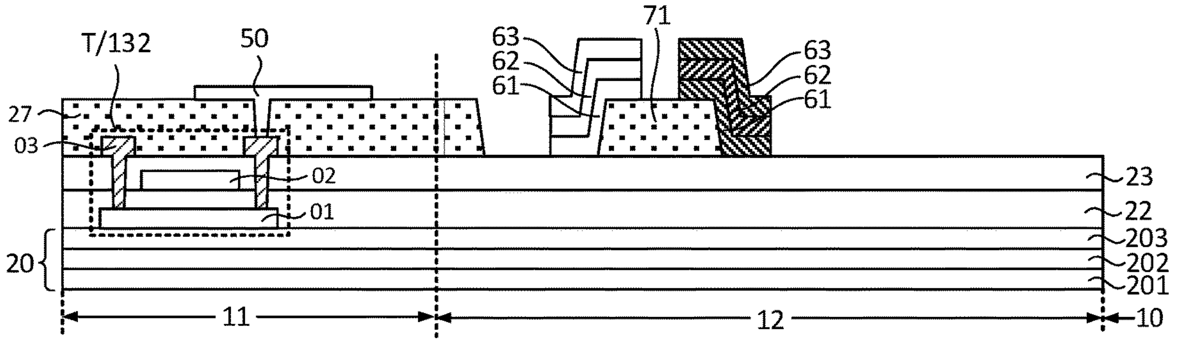

FIG. 12

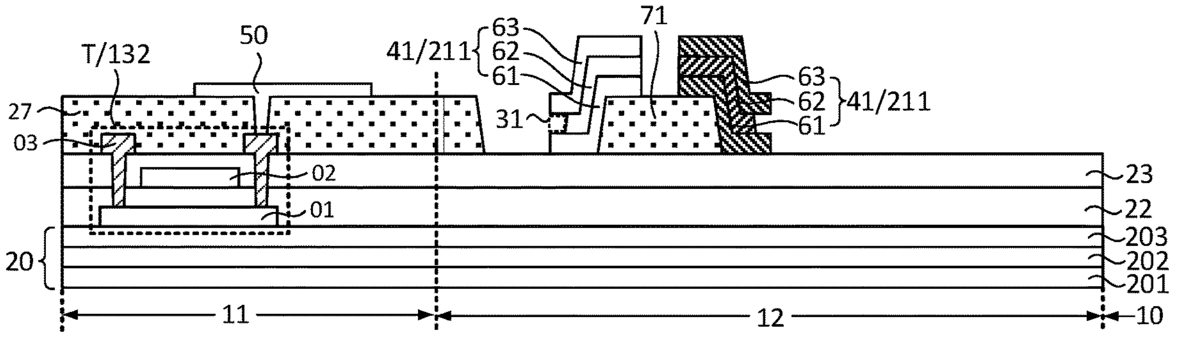

FIG. 13

DISPLAY PANEL, PREPARATION METHOD THEREFOR, AND DISPLAY DEVICE

CROSS-REFERENCE TO RELATED APPLICATION(S)

This application claims the priority of a Chinese patent application Ser. No. 202311749215.9, filed on Dec. 15, 2023, the disclosure of which is incorporated herein by reference in its entirety.

TECHNICAL FIELD

The present disclosure relates to the field of display technology and, in particular, to a display panel, a preparation method therefor, and a display device.

BACKGROUND

To increase the screen-to-body ratio of a display panel, an aperture is opened in the display region of the display panel to provide an accommodating aperture for a camera.

However, after the aperture is opened in the display panel, since the middle layer structure of the display panel is exposed at the cut section of the aperture, in one aspect, static electricity will enter the display region through the cut section of the aperture, resulting in abnormal display in the display region around the aperture region; in another aspect, the middle layer structure of the display panel at the cut section of the aperture is electrically charged, which is likely to cause dark spots formed by electrochemical corrosion, affecting display quality.

SUMMARY

The present disclosure provides a display panel, a preparation method therefor, and a display device.

According to one aspect of the present disclosure, a display panel is provided. The display panel includes an aperture region, a display region surrounding the aperture region, and an isolating region located between the display region and the aperture region.

The display panel further includes a base substrate and a partition retaining wall located on one side of the base substrate, and the partition retaining wall is located in the isolating region.

The partition retaining wall includes a metal partition portion and an insulating retaining wall portion; in a direction in which the display region points to the aperture region, a sidewall on one side of the metal partition portion facing away from the insulating retaining wall portion includes a first recess structure, and the first recess structure is recessed towards one side of the insulating retaining wall portion.

The metal partition portion includes a first metal partition portion and a second metal partition portion.

In the direction in which the display region points to the aperture region, the insulating retaining wall portion is located between the first metal partition portion and the second metal partition portion, and the first metal partition portion and the second metal partition portion are insulated from each other.

The display panel further includes a cathode layer, and the cathode layer extends from the display region to the isolating region.

In a thickness direction of the base substrate, the cathode layer is located on one side of the partition retaining wall facing away from the base substrate, and the cathode layer is separated at the first recess structure.

According to another aspect of the present disclosure, a method for preparing a display panel is provided, where the display panel includes an aperture region, a display region surrounding the aperture region, and an isolating region located between the display region and the aperture region.

The preparation method includes the following steps.

A partition retaining wall is prepared on one side of a base subtract in the isolating region, where the partition retaining wall includes a metal partition portion and an insulating retaining wall portion; in a direction in which the display region points to the aperture region, a sidewall on one side of the metal partition portion facing away from the insulating retaining wall portion includes a first recess structure, and the first recess structure is recessed towards one side of the insulating retaining wall portion; the metal partition portion includes a first metal partition portion and a second metal partition portion; in the direction in which the display region points to the aperture region, the insulating retaining wall portion is located between the first metal partition portion and the second metal partition portion, and the first metal partition portion and the second metal partition portion are insulated from each other.

A cathode layer is prepared on one side of the partition retaining wall facing away from the base substrate, where the cathode layer extends from the display region to the isolating region, and the cathode layer is separated at the first recess structure.

According to another aspect of the present disclosure, a display device is provided. The display device includes the display panel described in the first aspect.

In the display panel, the preparation method therefor, and the display device provided by embodiments of the present disclosure, a partition retaining wall is provided in the isolating region between the display region and the aperture region, the partition retaining wall includes a first metal partition portion and a second metal partition portion that are sequentially arranged in a direction in which the display region points to the aperture region, and by providing first recess structures on the sidewalls of both the first metal partition portion and the second metal partition portion, the cathode layer is separated at the positions of the first recess structures on the first metal partition portion and the second metal partition portion, respectively. Moreover, an insulating retaining wall portion is provided between the first metal partition portion and the second metal partition portion so that the electrical connection between the first metal partition portion and the second metal partition portion is cut off by the insulating retaining wall portion.

BRIEF DESCRIPTION OF DRAWINGS

To illustrate technical solutions in embodiments of the present disclosure more clearly, the drawings used in the description of the embodiments are briefly described below. Apparently, the drawings described below only illustrate part of the embodiments of the present disclosure, and those of ordinary skill in the art may obtain other drawings based on the drawings described below on the premise that no creative work is done.

FIG. 11 is a flowchart of a method for preparing a display panel according to an embodiment of the present disclosure;

FIGS. 12 and 13 are structural diagrams of the flow of a method for preparing a display panel according to an embodiment of the present disclosure;

DETAILED DESCRIPTION

To make the solutions of the present disclosure better understood by those skilled in the art, the technical solutions in embodiments of the present disclosure are described below clearly and completely in conjunction with drawings in the embodiments of the present disclosure. Apparently, the embodiments described below are part, not all, of the embodiments of the present disclosure. Based on the embodiments of the present disclosure, all other embodiments obtained by those of ordinary skill in the art on the premise that no creative work is done are within the scope of the present disclosure.

It is to be noted that the terms such as "first" and "second" in the description, claims, and drawings of the present disclosure are used for distinguishing between similar objects and are not necessarily used for describing a particular order or sequence. It is to be understood that the data used in this manner is interchangeable in appropriate cases so that the embodiments of the present disclosure described herein can be implemented in an order not illustrated or described herein. In addition, the terms "including", "having", and any other variations thereof are intended to cover a non-exclusive inclusion. For example, a process, a method, a system, a product, or a device that includes a series of steps or units may include not only the expressly listed steps or units but also other steps or units that are not expressly listed or are inherent to the process, the method, the product, or the device.

Figure 1:
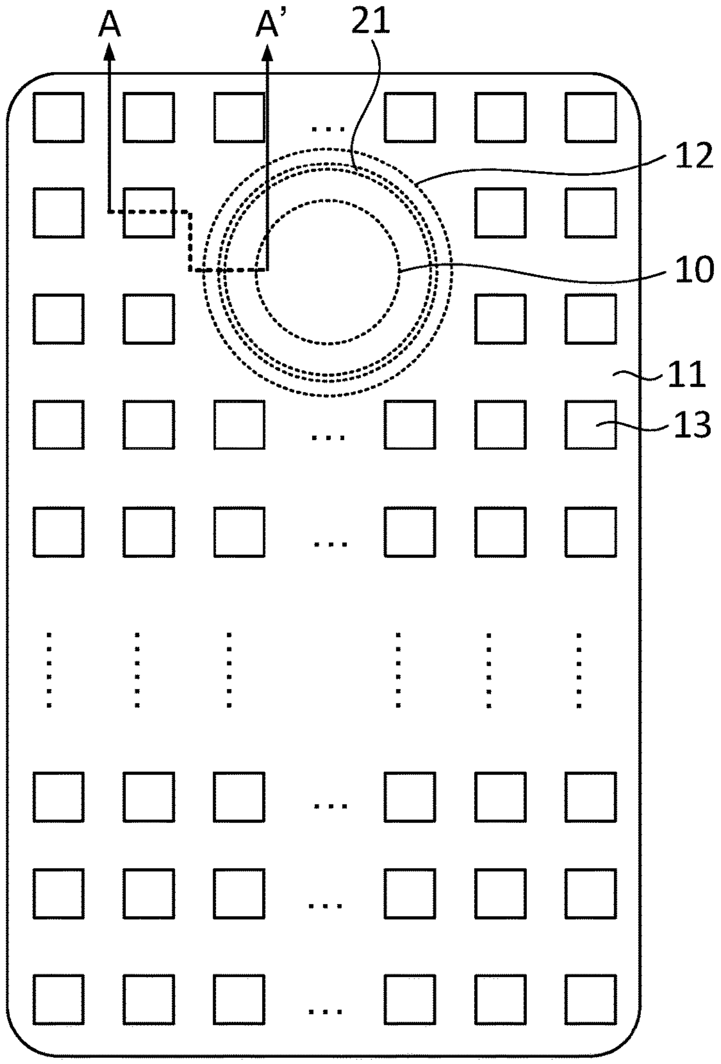
FIG. 1 is a structural diagram of a display panel according to an embodiment of the present disclosure.
Figure 2:
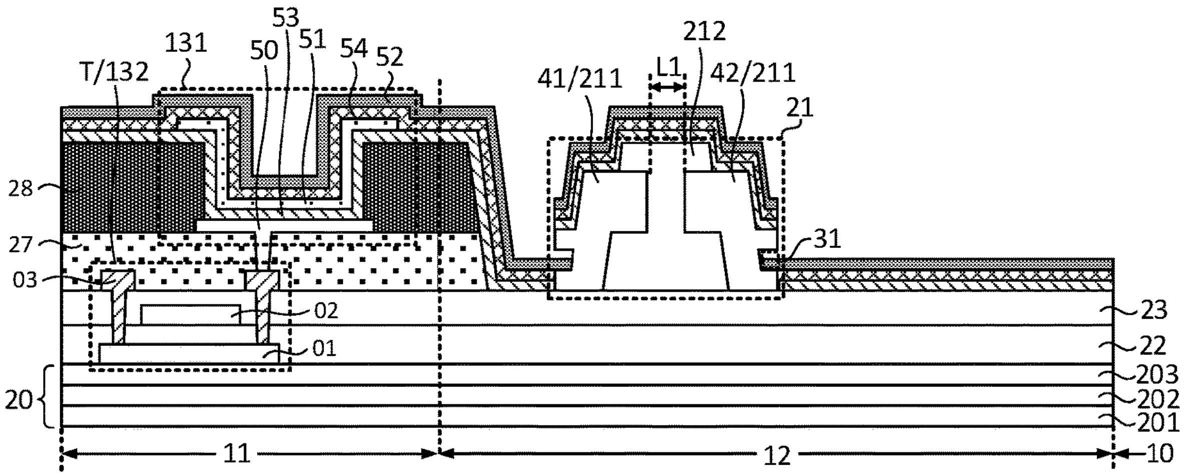
FIG. 2 is a sectional view taken along the direction A-A' of FIG. 1.

FIG. 1 is a structural diagram of a display panel according to an embodiment of the present disclosure. FIG. 2 is a sectional view taken along direction A-A' of FIG. 1. As shown in FIGS. 1 and 2, the display panel provided by this embodiment of the present disclosure includes an aperture region 10, a display region 11 surrounding the aperture region 10, and an isolating region 12 located between the display region 11 and the aperture region 10. The display panel further includes a base substrate 20 and a partition retaining wall 21 located on one side of the base substrate 20, and the partition retaining wall 21 is located in the isolating region 12. The partition retaining wall 21 includes a metal partition portion 211 and an insulating retaining wall portion 212; in a direction in which the display region 11 points to the aperture region 10, a sidewall on one side of the metal partition portion 211 facing away from the insulating retaining wall portion 212 includes a first recess structure 31, and the first recess structure 31 is recessed towards one side of the insulating retaining wall portion 212. The metal partition portion 211 includes a first metal partition portion 41 and a second metal partition portion 42. In the direction in which the display region 11 points to the aperture region 10, the insulating retaining wall portion 212 is located between the first metal partition portion 41 and the second metal partition portion 42, and the first metal partition portion 41 and the second metal partition portion 42 are insulated from each other. The display panel further includes a cathode layer 52, and the cathode layer 52 extends from the display region 11 to the isolating region 12. In a thickness direction of the base substrate 20, the cathode layer 52 is located on one side of the partition retaining wall 21 facing away from the base substrate 20, and the cathode layer 52 is separated at the first recess structure 31.

Specifically, as shown in FIGS. 1 and 2, the aperture region 10 is used for accommodating a photosensitive element, and the photosensitive element may be, but is not limited to, a camera, a light sensor, a distance sensor, a depth sensor, an iris recognition sensor or an infrared sensor.

The aperture region 10 may be a non-display region, that is, the aperture region 10 does not emit light, thereby reducing the impact on the use performance of the photosensitive element.

In addition, the aperture region 10 may be a rectangular region, a circular region or an elliptical region. The position of the aperture region 10 may be set on any side of the display panel. Those skilled in the art may set the shape and the position of the aperture region 10 according to actual needs, and the embodiments of the present disclosure do not make specific limitations in this regard.

With continued reference to FIGS. 1 and 2, the display region 11 is disposed around the aperture region 10, the display region 11 includes a plurality of sub-pixels 13 arranged in an array in the display region 11, the sub-pixel 13 may include a light-emitting unit 131 and a pixel driving circuit 132 electrically connected to the light-emitting unit 131, and the pixel driving circuit 132 is configured to drive the light-emitting unit 131 electrically connected thereto to emit light to implement a display function.

Further, as shown in FIG. 2, the display panel further includes a base substrate 20, and the base substrate 20 may include a first substrate 201, a first inorganic layer 202, and a second substrate 203 that are sequentially stacked.

The materials of the first substrate 201 and the second substrate 203 may include organic materials, such as polyimide, which is not limited thereto.

The first inorganic layer 202 can block moisture and oxygen from entering the pixel driving circuit 132 to guarantee the driving performance of the pixel driving circuit 132, where the material of the first inorganic layer 202 may include SiOx or SiNx, which is not limited thereto.

With continued reference to FIG. 2, optionally, the pixel driving circuit 132 is disposed on one side of the base substrate 20. The pixel driving circuit 132 includes at least one thin-film transistor T, and the thin-film transistor T may include an active layer 01, a gate layer 02, and a source-drain electrode layer 03 that are sequentially stacked. A gate insulating layer 22 is disposed between the active layer 01 and the gate layer 02, and an interlayer insulating layer 23 is disposed between the gate layer 02 and the source-drain electrode layer 03, so as to insulate the active layer 01, the gate layer 02, and the source-drain electrode layer 03 from each other, thereby ensuring normal operation of the thin-film transistor T.

The materials of the gate insulating layer 22 and the interlayer insulating layer 23 may include SiOx or SiNx, which is not limited thereto.

With continued reference to FIG. 2, the light-emitting unit 131 is disposed on one side of the pixel driving circuit 132 facing away from the base substrate 20. For example, for illustration, when the display panel is an organic light-emitting diode (OLED) display panel, the light-emitting unit 131 may be an organic light-emitting diode, and the light-emitting unit 131 may include an anode layer 50, an emission layer 51, and a cathode layer 52 that are sequentially stacked. The emission layer 51 may be an organic emission layer (EML), electrons are injected into the emission layer 51 through the cathode layer 52, holes are injected into the emission layer 51 through the anode layer 50, and the electrons and holes are recombined in the emission layer 51 to emit light.

It is to be noted that the pixel driving circuit 132 transmits a drive current to the light-emitting unit 131 under the action of signals from signal lines (such as scan signal lines, data signal lines, and power signal lines) on the display panel to provide the drive current for the light-emitting unit 131. In this case, electrons and holes are injected into the light-emitting layer 51 from the cathode layer 52 and the anode layer 50, respectively, to form excitons in the emission layer 51. The excitons excite the light-emitting molecules so that the emission layer 51 emits visible light.

With continued reference to FIG. 2, optionally, a first functional layer 53 may be disposed between the anode layer 50 and the emission layer 51, and the first functional layer 53 may include a hole injection layer (HIL) and a hole transport layer (HTL), where the hole injection layer (HIL) is mainly used for improving the ability to transfer holes from the anode layer 50 to the emission layer 51, and the hole transport layer (HTL) mainly plays the role of transferring holes to the emission layer 51.

A second functional layer 54 may also be disposed between the emission layer 51 and the cathode layer 52, and the second functional layer 54 may include an electron transport layer (ETL) and an electron injection layer (EIL), where the electron transport layer (ETL) mainly plays the role of transferring electrons to the emission layer 51, and the electron injection layer (EIL) is mainly used for improving the ability to transfer electrons from the cathode layer 52 to the emission layer 51, thereby reducing the drive voltage of the light-emitting unit 131.

The inventors have found after research that the cathode layer 52 is usually set as a whole layer, and the cathode layer 52 extends from the display region 11 to the cut section of the aperture region 10 so that the cross section of the cathode layer 52 is exposed from the cross section of the aperture region 10. In one aspect, in the copper rod friction or electro-static discharge (ESD) test, the generated static electricity enters the display region 11 through the cut section of the aperture region 10 via the cathode layer 52, which causing electrical interference with the sub-pixels 13 in the display region 11 and ultimately resulting in the abnormal display in the display region 11 around the aperture region 10. In another aspect, in the reliability (RA) test under high temperature and high humidity conditions, moisture and oxygen in the environment are likely to seep in from the cut section of the aperture region 10, and the cathode layer 52 is electrically charged at the cut section of the aperture region 10, which is likely to cause dark spots formed by electrochemical corrosion, thereby affecting the display quality.

Based on the above technical problems, as shown in FIGS. 1 and 2, in this embodiment of the present disclosure, an isolating region 12 is disposed between the display region 11 and the aperture region 10, a partition retaining wall 21 is disposed in the isolating region 12, the partition retaining wall 21 includes a metal partition portion 211, and the metal partition portion 211 includes a first metal partition portion 41 and a second metal partition portion 42 arranged in the direction in which the display region 11 points to the aperture region 10.

In the direction in which the display region 11 points to the aperture region 10, a first recess structure 31 is disposed on a sidewall on one side of the first metal partition portion 41 facing away from the second metal partition portion 42. In this manner, when the cathode layer 52 is prepared on one side of the partition retaining wall 21 facing away from the base substrate 20, the cathode layer 52 is not able to cover the first recess structure 31 on the second metal partition portion 42, thereby allowing the cathode layer 52 to be separated at the position of the first recess structure 31 on the second metal partition portion 42.

Similarly, in the direction in which the display region 11 points to the aperture region 10, a first recess structure 31 is also disposed on a sidewall on one side of the second metal partition portion 42 facing away from the first metal partition portion 41. When the cathode layer 52 is prepared on one side of the partition retaining wall 21 facing away from the base substrate 20, the cathode layer 52 is not able to cover the first recess structure 31 on the first metal partition portion 41, thereby allowing the cathode layer 52 to be separated at the position of the first recess structure 31 on the first metal partition portion 41.

Moreover, the first functional layer 53 and the second functional layer 54 are also set as a whole layer, and when the first functional layer 53 and the second functional layer 54 are formed by vapor deposition on one side of the partition retaining wall 21 facing away from the base substrate 20, the first functional layer 53 and the second functional layer 54 are also separated at the position of the first recess structure 31 on the metal partition portion 211. In this manner, even if moisture and oxygen in the environment seep in from the first functional layer 53 and the second functional layer 54 at the cut section of the aperture region 10, the transmission path is cut off at the partition retaining wall 21 so that moisture and oxygen cannot enter the display region 11, thereby reducing the influence of moisture and oxygen on the display quality of the display region 11 and improving the display effect.

The inventors have further found that although the first recess structure 31 on the metal partition portion 211 can isolate the cathode layer 52, the cross section of the cathode layer 52 forms a connection with the sidewall of the metal partition portion 211, and since the metal partition portion 211 is a metal structure with conductive properties, the electricity on the cathode layer 52 is able to form a conductive path through the metal partition portion 211.

For example, as shown in FIG. 2, the sidewall of the first metal partition portion 41 is in contact with the cross section of the cathode layer 52 so that an electrical connection is formed between the first metal partition portion 41 and the cathode layer 52; similarly, the sidewall of the second metal partition portion 42 is in contact with the cross section of the cathode layer 52 so that an electrical connection is formed between the second metal partition portion 42 and the cathode layer 52. In this manner, if a conductive path is formed between the first metal partition portion 41 and the second metal partition portion 42, the cathode layer 52 on both sides of the partition retaining wall 21 forms a conductive path through the first metal partition portion 41 and the second metal partition portion 42 so that static electricity cannot be prevented from entering the display region 11 through the cut section of the aperture region 10 via the cathode layer 52, and the cathode layer 52 cannot be prevented from becoming electrically charged at the cut section of the aperture region 10, thereby resulting in dark spots formed by electrochemical corrosion and affecting the display quality.

Based on the above technical problems, in this embodiment, as shown in FIG. 2, in the direction in which the display region 11 points to the aperture region 10, an insulating retaining wall portion 212 is disposed between the first metal partition portion 41 and the second metal partition portion 42, and the insulating retaining wall portion 212 is used for insulating the first metal partition portion 41 and the second metal partition portion 42 from each other. In this manner, the insulating retaining wall portion 212 can cut off the electrical connection between the first metal partition portion 41 and the second metal partition portion 42, the cathode layer 52 on both sides of the partition retaining wall 21 will not form a conductive path through the first metal partition portion 41 and the second metal partition portion 42. Even if the static electricity enters through the cathode layer 52 at the cut section in the aperture region 10, the transmission path is cut off at the partition retaining wall 21 in the isolating region 12 so that the static electricity cannot enter the display region 11, thereby preventing static electricity from causing electrical interference with the sub-pixels 13 in the display region 11 and solving the problem of the abnormal display in the display region 11 around the aperture region 10. Moreover, the power signal transmitted on the partition retaining wall 21 cannot be transmitted to the cut section of the aperture region 10 through the isolating region 12, thereby solving the problem of the formation of dark spots due to electrochemical corrosion at the cut section in the aperture region 10 and improving the display quality.

Further, as shown in FIG. 1, the partition retaining wall 21 may be disposed around the aperture region 10 to achieve the all-round isolation of the cathode layer 52.

With continued reference to FIG. 2, optionally, in the direction in which the display region 11 points to the aperture region 10, the shortest distance between the first metal partition portion 41 and the second metal partition portion 42 is L1, where 3 μm≤L1≤5 μm. In this manner, in one aspect, the spacing between the first metal partition portion 41 and the second metal partition portion 42 is not too small so as to avoid the short circuit between the first metal partition portion 41 and the second metal partition portion 42, and the preparing process has a relatively low difficulty and is easy to implement; in another aspect, the spacing between the first metal partition portion 41 and the second metal partition portion 42 is not too large so as to avoid the great increase in the width of the isolating region 12, thereby ensuring that the display panel has a large screen-to-body ratio and improving the aesthetics of the display panel.

In conclusion, in the display panel provided by this embodiment of the present disclosure, a partition retaining wall is disposed in the isolating region between the display region and the aperture region, the partition retaining wall includes a first metal partition portion and a second metal partition portion that are sequentially arranged in the direction in which the display region points to the aperture region, and by providing first recess structures on the sidewalls of both the first metal partition portion and the second metal partition portion, the cathode layer is separated at the positions of the first recess structures on the first metal partition portion and the second metal partition portion, respectively. Moreover, an insulating retaining wall portion is provided between the first metal partition portion and the second metal partition portion so that the electrical connection between the first metal partition portion and the second metal partition portion is cut off by the insulating retaining wall portion. In this manner, the cathode layer on both sides of the partition retaining wall will not form a conductive path through the first metal partition portion and the second metal partition portion. Even if the static electricity enters through the cathode layer at the cut section in the aperture region, the transmission path is cut off at the partition retaining wall in the isolating region, so that the static electricity cannot enter the display region, thereby preventing static electricity from causing electrical interference with the sub-pixels in the display region and solving the problem of the abnormal display in the display region around the aperture region. Moreover, the power signal transmitted on the partition retaining wall cannot be transmitted to the cut section of the aperture region through the isolating region, thereby solving the problem of the formation of dark spots due to electrochemical corrosion at the cut section in the aperture region and improving the display quality.

Figure 3:
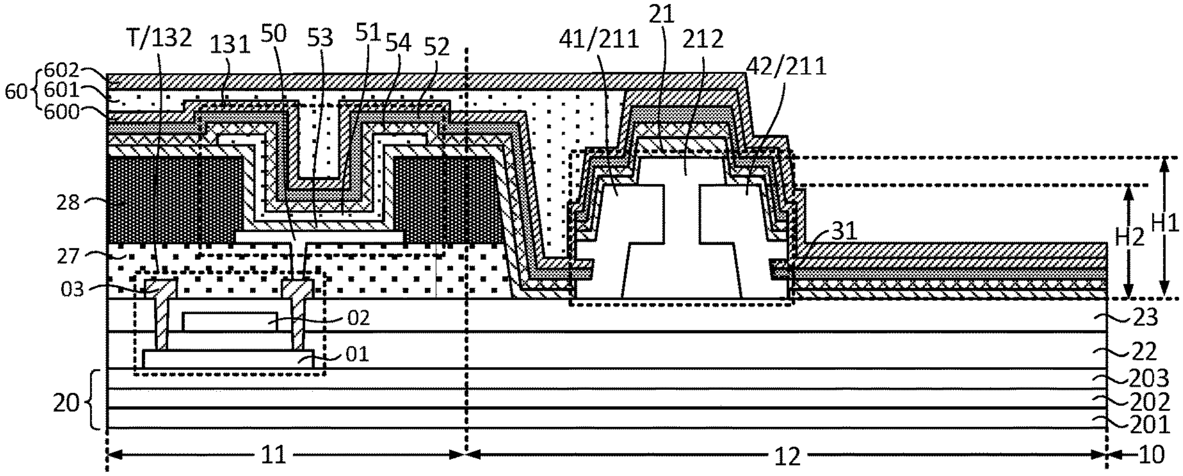
FIG. 3 is a sectional view of a display panel according to an embodiment of the present disclosure.

FIG. 3 is a sectional view of a display panel according to an embodiment of the present disclosure. As shown in FIG. 3, optionally, the display panel provided by this embodiment of the present disclosure further includes a thin-film encapsulation layer 60, and in the thickness direction of the base substrate 20, the thin-film encapsulation layer 60 is located on one side of the partition retaining wall 221 facing away from the base substrate 20. The thin-film encapsulation layer 60 includes an organic encapsulation layer 61, and the organic encapsulation layer 61 is located on one side of the partition retaining wall 21 facing away from the aperture region 10.

Specifically, as shown in FIG. 3, a thin-film encapsulation layer 60 is disposed on one side of the light-emitting unit 131 facing away from the base substrate 20, and the thin-film encapsulation layer 60 may include a first inorganic encapsulation layer 600, an organic encapsulation layer 601, and a second inorganic encapsulation layer 602 that are stacked. The first inorganic encapsulation layer 600 and the second inorganic encapsulation layer 602 can block moisture and oxygen in the external environment. The organic encapsulation layer 601 can provide flattened film deposition conditions for the subsequently formed inorganic encapsulation layer, relieve stress, and cover surface steps and impurities to provide excellent particle encapsulation effects, but the organic encapsulation layer 601 has poor performance in blocking moisture and oxygen.

Further, with continued reference to FIG. 3, in the isolating region 12 between the display region 11 and the aperture region 10, the partition retaining wall 21 may be used for blocking the organic encapsulation layer 601 in the thin-film encapsulation layer 60 to block the organic encapsulation layer 601 from extending to the side of the partition retaining wall 21 facing away from the aperture region 10 and prevent the organic encapsulation layer 601 from overflowing into the aperture region 10, thereby preventing moisture and oxygen in the external environment from laterally corroding the display panel through the organic encapsulation layer 601.

With continued reference to FIG. 3, optionally, the height of the insulating retaining wall portion 212 is H1, and the height of the metal partition portion 211 is H2, where H1≥H2.

As shown in FIG. 3, by setting the height H1 of the insulating retaining wall portion 212 to be greater than or equal to the height H2 of the metal partition portion 211, the partition retaining wall 21 is prevented from forming a recess at the top of the insulating retaining wall portion 212 to prevent the cathode layer 52 from being separated at the recess formed at the top of the insulating retaining wall portion 212. In this manner, a conductive path is prevented from being formed between the first metal partition portion 41 and the second metal partition portion 42 when the cross section of the cathode layer 52 is in contact with both the first metal partition portion 41 and the second metal partition portion 42, thereby ensuring that the first metal partition portion 41 and the second metal partition portion 42 are insulated from each other. In this manner, the insulating retaining wall portion 212 can cut off the electrical connection between the first metal partition portion 41 and the second metal partition portion 42, the cathode layer 52 on both sides of the partition retaining wall 21 will not form a conductive path through the first metal partition portion 41 and the second metal partition portion 42, and even if the static electricity enters through the cathode layer 52 at the cut section in the aperture region 10, the transmission path is cut off at the partition retaining wall 21 in the isolating region 12 so that the static electricity cannot enter the display region 11, thereby preventing static electricity from causing electrical interference with the sub-pixels 13 in the display region 11 and solving the problem of the abnormal display in the display region 11 around the aperture region 10. Moreover, the power signal transmitted on the partition retaining wall 21 cannot be transmitted to the cut section of the aperture region 10 through the isolating region 12, thereby solving the problem of the formation of dark spots due to electrochemical corrosion at the cut section in the aperture region 10 and improving the display quality.

Optionally, the height H1 of the insulating retaining wall portion 212 may satisfy 600 nm≤H1≤1000 nm. In this manner, in one aspect, the height H1 of the insulating retaining wall portion 212 is not too small so that the size of the first recess structure 31 can be prevented from being compressed and thus can satisfy the needs of isolating the cathode layer 52; in another aspect, the height H1 of the insulating retaining wall portion 212 is also not too large to avoid the great increase in the thickness of the display panel, thereby facilitating the implementation of the lightness and thinness of the display panel.

In addition, the height H2 of the metal partition portion 211 may be set according to actual needs, and the embodiments of the present disclosure do not make specific limitations in this regard.

Figure 4:
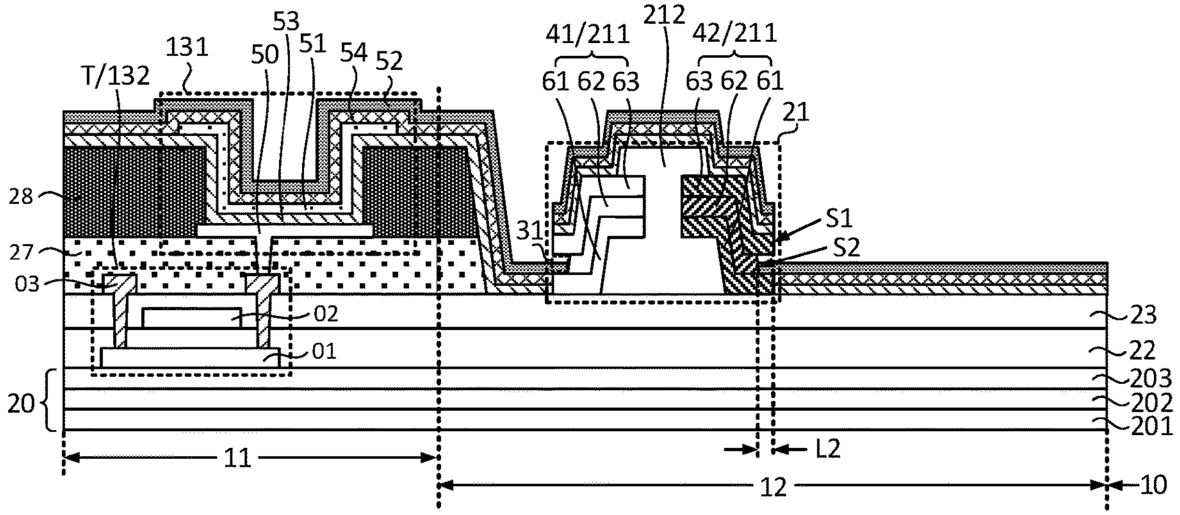
FIG. 4 is a sectional view of another display panel according to an embodiment of the present disclosure.

FIG. 4 is a sectional view of another display panel according to an embodiment of the present disclosure. As shown in FIG. 4, optionally, the metal partition portion 211 includes a first metal layer 61, a second metal layer 62, and a third metal layer 63, the third metal layer 63 is located on one side of the first metal layer 61 facing away from the base substrate 20, and the second metal layer 62 is located between the first metal layer 61 and the third metal layer 63. The material of the first metal layer 61 is the same as the material of the third metal layer 63, and the material of the first metal layer 61 is different from the material of the second metal layer 62. In the direction in which the display region 11 points to the aperture region 10, a boundary on one side of the second metal layer 62 facing away from the insulating retaining wall portion 212 is a second boundary S2, a boundary on one side of the third metal layer 63 facing away from the insulating retaining wall portion 212 is a first boundary S1, and the second boundary S2 is located closer to the insulating retaining wall portion 212 than the first boundary S1.

Specifically, as shown in FIG. 4, the metal partition portion 211 may be a three-layer metal structure. The metal partition portion 211 includes a first metal layer 61, a second metal layer 62, and a third metal layer 63 that are sequentially stacked, where the material of the first metal layer 61 is the same as the material of the third metal layer 63, and the material of the second metal layer 62 is different from the material of the first metal layer 61 and the third metal layer 63.

During the preparation of the metal partition portion 211, the sidewall of the three-layer metal structure may be etched, and a suitable etching gas or liquid is selected for the second metal layer 62 to make the etching rate of both the first metal layer 61 and the third metal layer 63 much smaller than the etching rate of the second metal layer 62 so that the second metal layer 62 located in the intermediate layer is preferentially etched and the sidewall of the second metal layer 62 is recessed inwardly to form the first recess structure 31.

Optionally, the first metal layer 61 and the third metal layer 63 may be titanium layers, the second metal layer 62 may be an aluminum layer, and the metal partition portion 211 is a titanium/aluminum/titanium three-layer metal structure. During the preparation of the metal partition portion 211, the titanium/aluminum/titanium three-layer metal structure may be etched, and since the etching rate of titanium is much smaller than the etching rate of aluminum, the aluminum layer located in the intermediate layer is preferentially etched when the titanium/aluminum/titanium three-layer metal structure is etched so that the sidewall of the aluminum layer is preferentially etched to form a notch that is recessed inwardly to form the first recess structure 31.

With continued reference to FIG. 4, after the sidewall of the second metal layer 62 is etched, in the direction in which the display region 11 points to the aperture region 10, a first boundary S1 of the second metal layer 62 is located on one side of a second boundary S2 of the third metal layer 63 adjacent to the insulating retaining wall portion 211 to form a first recess structure 31. In this manner, when the cathode layer 52 is prepared on one side of the insulating retaining wall 21 facing away from the base substrate 20, the cathode layer 52 is unable to cover the first recess structure 31 on the metal partition portion 211 so that the cathode layer 52 is separated at the position of the first recess structure 31 on the first metal partition portion 41.

Moreover, when the first functional layer 53 and the second functional layer 54 are formed by vapor deposition on one side of the partition retaining wall 21 facing away from the base substrate 20, the first functional layer 53 and the second functional layer 54 are also separated at the position of the first recess structure 31 on the metal partition portion 211. In this manner, even if moisture and oxygen in the environment seep in from the first functional layer 53 and the second functional layer 54 at the cut section of the aperture region 10, the transmission path is cut off at the partition retaining wall 21 so that moisture and oxygen cannot enter the display region 11, thereby reducing the influence of moisture and oxygen on the display quality of the display region 11 and improving the display effect.

With continued reference to FIG. 4, optionally, in the direction in which the display region 11 points to the aperture region 10, the shortest distance L2 between the first boundary S1 of the third metal layer 63 and the second boundary S2 of the second metal layer 62 satisfies 3 μm≤L2≤10 μm. In this manner, in one aspect, the depth of the first recess structure 31 is not too shallow in the direction in which the display region 11 points to the aperture region 10 to ensure that the cathode layer 52 is separated at the first recess structure 31; in another aspect, the depth of the first recess structure 31 is also not too deep in the direction in which the display region 11 points to the aperture region 10 to avoid the increase in the process difficulty and make the process easy to implement.

It is to be noted that the shape of the sidewall of the metal partition portion 211 in FIGS. 2 and 4 is only for simplified illustration and is not intended to limit the present disclosure, and the sidewall formed by the actual etching process may not be in a regular shape.

Figure 5:
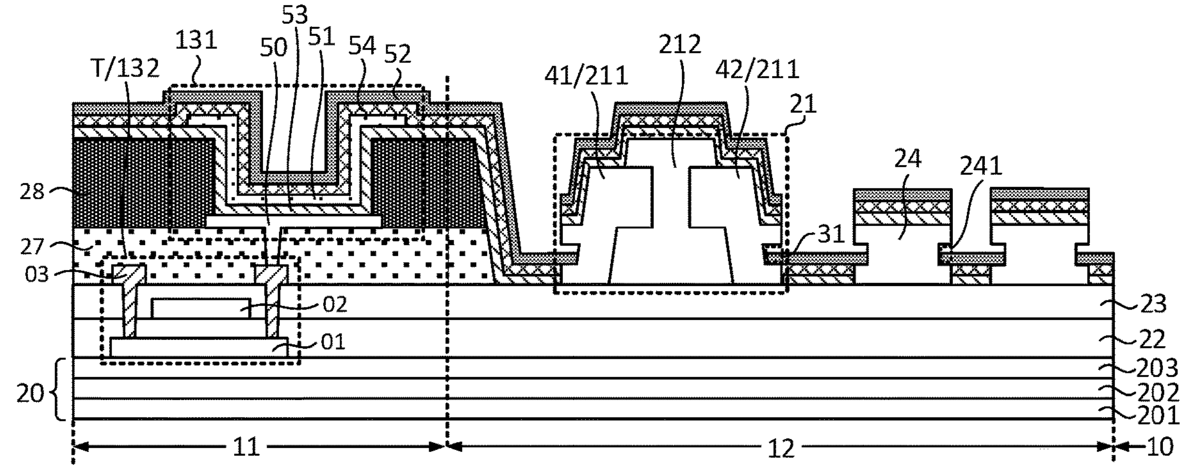
FIG. 5 is a sectional view of another display panel according to an embodiment of the present disclosure.

FIG. 5 is a sectional view of another display panel according to an embodiment of the present disclosure. As shown in FIG. 5, optionally, the isolating region 12 further includes at least one metal isolating column 24, a sidewall of a metal isolating column 24 is recessed internally to form a second recess structure 241, and the metal partition portion 211 and the metal isolating column 24 are located in the same film layer.

Specifically, as shown in FIG. 5, a metal isolating column 24 is also disposed in the isolating region 12 between the display region 11 and the aperture region 10, the sidewall of the metal isolating column 24 has a second recess structure 241. When the first functional layer 53, the second functional layer 54, and the cathode layer 52 are formed by vapor deposition on one side of the metal isolating column 24 facing away from the base substrate 20, the first functional layer 53, the second functional layer 54, and the cathode layer 52 can be separated at the position of the second recess structure 241. In this manner, even if moisture and the oxygen in the environment seep in from the first functional layer 53 and the second functional layer 54 at the cut section of the aperture region 10, the transmission path is cut off at the metal isolating column 24 so that moisture and oxygen cannot enter the display region 11, thereby reducing the influence of moisture and oxygen on the display quality of the display region 11 and improving the display effect.

The metal isolating column 24 may be disposed around the aperture region 10 in the same manner as the partition retaining wall 21 to isolate the first functional layer 53, the second functional layer 54, and the cathode layer 52 in an all-around manner, thereby further reducing the influence of moisture and oxygen on the display quality of the display region 11 and improving the display effect.

It is to be noted that although the metal isolating column 24 can isolate the cathode layer 52, the cathode layer 52 on both sides of the metal isolating column 24 forms a conductive path through the metal isolating column 24 because the metal isolating column 24 is made of metal and has conductive properties, thereby making the metal isolating column 24 unable to block the transmission of static electricity. While the partition retaining wall 21 in this embodiment of the present disclosure can insulate the first metal partition portion 41 and the second metal partition portion 42 from each other through the insulating retaining wall portion 212 to cut off the conductive path so that static electricity cannot enter the display region 11, thereby preventing static electricity from causing electrical interference with the sub-pixels 13 in the display region 11.

In this embodiment, by setting the metal partition portion 211 and the metal isolating column 24 in the same film layer, the setting of one metal film layer can be reduced, thereby achieving the purposes of reducing production costs and reducing the thickness of the display panel.

Moreover, the metal partition portion 211 may be made of the same material as the metal isolating column 24 so that the metal partition portion 211 and the metal isolating column 24 can be prepared in the same process, thereby shortening the process time.

It is to be noted that being located in the same film layer in the present application refers to being prepared through the same mask process, thereby reducing the number of masks used and reducing manufacturing costs. The details are not repeated here.

In addition, FIG. 5 is illustrated using an example where two metal isolating columns 24 are disposed in the isolating region 12. In other embodiments, the number of metal isolating columns 24 may be one or more, and the embodiments of the present disclosure do not make specific limitations in this regard.

Optionally, the height of the metal isolating column 24 may be 600 nm to 1000 nm. In this manner, in one aspect, the height of the metal isolating column 24 is not too small so that the size of the second recess structure 241 can be prevented from being compressed and thus the second recess structure 241 can satisfy the needs of isolating the first functional layer 53, the second functional layer 54, and the cathode layer 52; in another aspect, the height of the metal isolating column 24 is also not too large to avoid the great increase in the thickness of the display panel, thereby facilitating the implementation of the lightness and thinness of the display panel.

Figure 6:
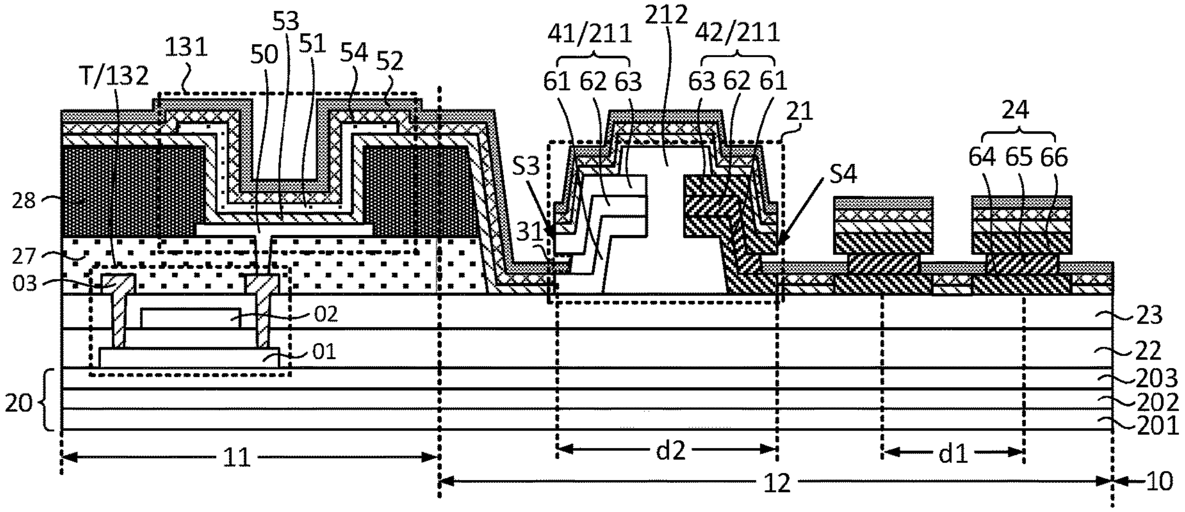
FIG. 6 is a sectional view of another display panel according to an embodiment of the present disclosure.

FIG. 6 is a sectional view of another display panel according to an embodiment of the present disclosure. As shown in FIG. 6, optionally, the metal isolating column 24 includes a fourth metal layer 64, a fifth metal layer 65, and a sixth metal layer 66, the sixth metal layer 66 is located on one side of the fourth metal layer 64 facing away from the base substrate 20, and the fifth metal layer 65 is located between the fourth metal layer 64 and the sixth metal layer 66. The material of the fourth metal layer 64 is the same as the material of the sixth metal layer 66, and the material of the fifth metal layer 65 is different from the material of the fourth metal layer 64 and the material of the sixth metal layer 66

As shown in FIG. 6, the metal isolating column 24 may be a three-layer metal structure. The metal isolating column 24 includes a fourth metal layer 64, a fifth metal layer 65, and a sixth metal layer 66 that are sequentially stacked, where the material of the fifth metal layer 65 is different from both the material of the fourth metal layer 64 and the material of the sixth metal layer 66. During the preparation of the metal isolating column 24, the sidewall of the three-layer metal structure may be etched, and a suitable etching gas or liquid is selected for the fifth metal layer 65 to make the etching rate of both the fourth metal layer 64 and the sixth metal layer 66 much smaller than the etching rate of the fifth metal layer 65 so that the fifth metal layer 65 located in the intermediate layer is preferentially etched and the sidewall of the fifth metal layer 65 is recessed inwardly to form the second recess structure 241.

Optionally, the fourth metal layer 64 and the sixth metal layer 66 may be titanium layers, the fifth metal layer 65 may be an aluminum layer, and the metal isolating column 24 is a titanium/aluminum/titanium three-layer metal structure. During the preparation of the metal isolating column 24, the titanium/aluminum/titanium three-layer metal structure may be etched. Since the etching rate of titanium is much smaller than the etching rate of aluminum, the aluminum layer located in the intermediate layer is preferentially etched when the titanium/aluminum/titanium three-layer metal structure is etched so that the sidewall of the aluminum layer is preferentially etched to form a notch that is recessed inwardly to form the second recess structure 241.

Further, the first metal layer 61 and the fifth metal layer 65 may be located in the same film layer, the second metal layer 62 and the fifth metal layer 65 may be located in the same film layer, and the third metal layer 63 and the sixth metal layer 66 may be located in the same film layer to reduce the number of metal film layers to be set, thereby achieving the purposes of reducing production costs and reducing a display panel thickness.

Moreover, the first metal layer 61 and the fifth metal layer 65 may be made of the same material, the second metal layer 62 and the fifth metal layer 65 may be made of the same material, and the third metal layer 63 and the sixth metal layer 66 may be made of the same material so that the first metal layer 61 and the fifth metal layer 65, the second metal layer 62 and the fifth metal layer 65, and the third metal layer 63 and the sixth metal layer 66 can be prepared in the same process, respectively, thereby shortening the process time.

It is to be noted that as shown in FIGS. 5 and 6, in the direction in which the display region 11 points to the aperture region 10, the metal isolating column 24 is located on one side of the partition retaining wall 21 adjacent to the aperture region 10, which is not limited here.

In other embodiments, the metal isolating column 24 may also be disposed on one side of the partition retaining wall 21 adjacent to the display region 11, and the embodiments of the present disclosure do not make specific limitations in this regard.

With continued reference to FIG. 6, optionally, the isolating region 12 includes at least two metal isolating columns 24, and in the direction in which the display region 11 points to the aperture region 10, the spacing between adjacent metal isolating columns 24 of the at least two metal isolating columns 24 is d1. In the direction in which the display region 11 points to the aperture region 10, a boundary on one side of the first metal partition portion 41 facing away from the insulating retaining wall portion 212 is a third boundary S3, a boundary on one side of the second metal partition portion 42 facing away from the insulating retaining wall portion 212 is a fourth boundary S4, and the distance between the third boundary S3 and the fourth boundary S4 is d2, where d2≥d1.

Specifically, as shown in FIG. 6, the cathode layer 52 is separated at the first recess structure 31 on the first metal partition portion 41, and the cathode layer 52 is also separated at the first recess structure 31 on the second metal partition portion 42. In this manner, the cathode layer 52 is separated by the partition retaining wall 21, and the length of the partition path is the distance d2 between the third boundary S3 and the fourth boundary S4.

In this embodiment, by setting the distance d2 between the third boundary S3 and the fourth boundary S4 to be greater than or equal to the spacing d1 between adjacent metal isolating columns 24, the separation path of the cathode layer 52 caused by the partition retaining wall 21 becomes longer to increase the electrical resistance at the position of the partition path and reduce the voltage on the separated cathode layer 52 on one side of the partition retaining wall 21 adjacent to the aperture region 10, thereby facilitating the decrease in the degree of electrochemical corrosion on the cathode layer 52 at the cut section of the aperture region 10.

With continued reference to FIG. 6, optionally, in the direction in which the display region 11 points to the aperture region 10, a boundary on one side of the first metal partition portion 41 facing away from the insulating retaining wall portion 212 is a third boundary S3, a boundary on one side of the second metal partition portion 42 facing away from the insulating retaining wall portion 212 is a fourth boundary S4, and the distance between the third boundary S3 and the fourth boundary S4 is d2, where 30 μm≤d2≤50 μm.

By setting the distance d2 between the third boundary S3 and the fourth boundary S4 to satisfy 30 μm≤d2≤50 μm, in one aspect, the separation path of the cathode layer 52 caused by the partition retaining wall 21 is not too short to avoid the electrical resistance at the position of the separation path being small, thereby avoiding the failure in the effective reduction of the voltage on the separated cathode layer 52 on one side of the partition retaining wall 21 adjacent to the aperture region 10 and the decrease in the degree of electrochemical corrosion on the cathode layer 52; in another aspect, the separation path of the cathode layer 52 caused by the partition retaining wall 21 is also not too long to avoid the great increase in the width of the isolating region 12, thereby ensuring that the display panel has a large screen-to-body ratio and improving the aesthetics of the display panel.

Figure 7:
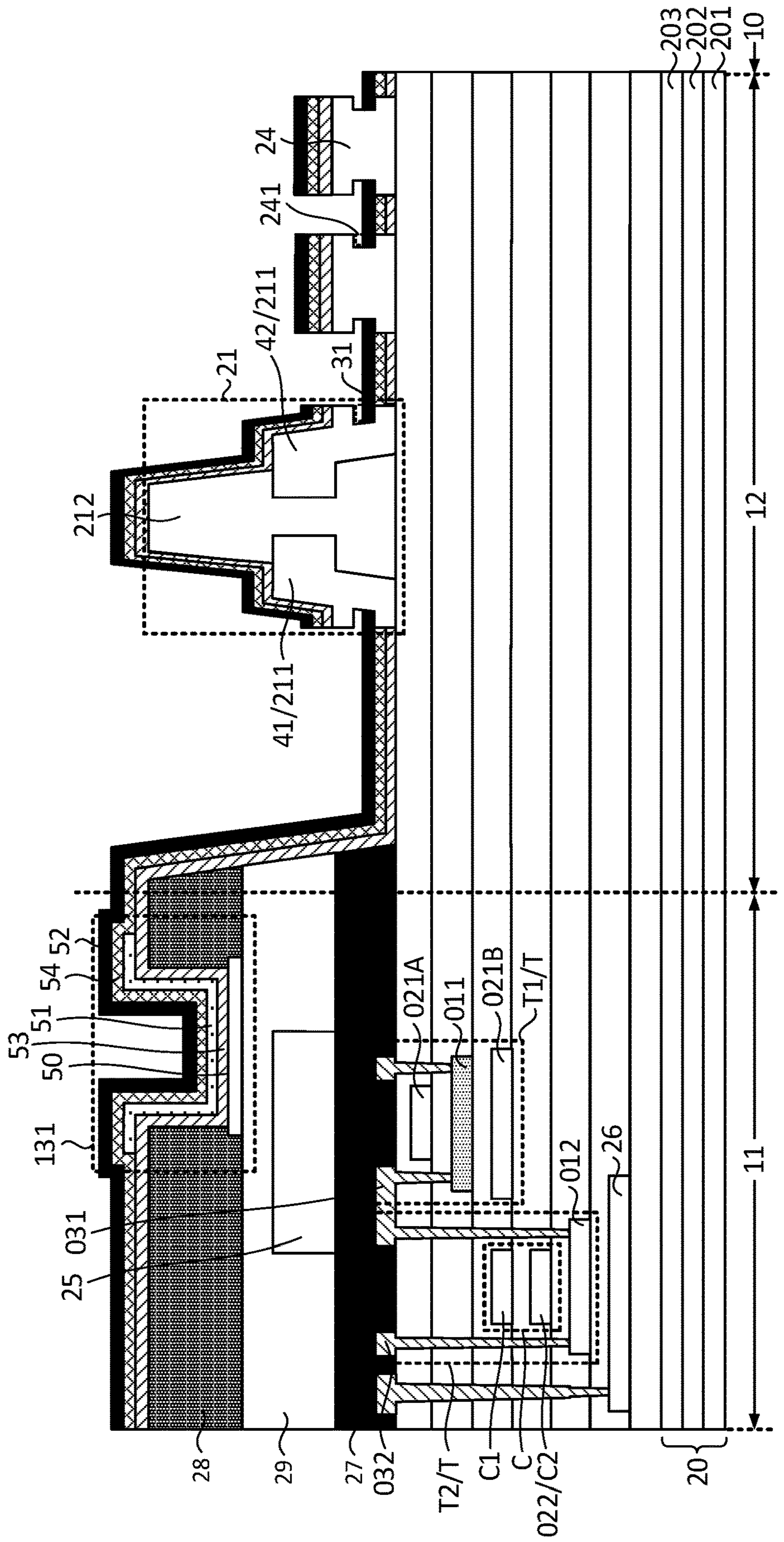
FIG. 7 is a sectional view of another display panel according to an embodiment of the present disclosure.

FIG. 7 is a sectional view of another display panel according to an embodiment of the present disclosure. As shown in FIG. 7, optionally, the display panel provided by this embodiment of the present disclosure further includes a signal line 25, and the metal partition portion 211 and the signal line 25 are located in the same film layer.

Specifically, the display panel is provided with a plurality of signal lines 25 in the display region 11, and the pixel driving circuit on the display panel transmits a drive current to the light-emitting unit under the action of the signals from the signal lines 25 on the display panel to provide the drive current for the light-emitting unit so that the light-emitting unit emits visible light.

The signal line 25 may include a scan signal line, a data signal line, a power signal line, and the like, and the embodiments of the present disclosure do not make specific limitations in this regard.

In this embodiment, by setting the metal partition portion 211 and the signal line 25 in the same film layer, one metal film layer can be reduced, thereby achieving the purposes of reducing production costs and reducing the thickness of the display panel.

Moreover, the metal partition portion 211 and the signal line 25 may be made of the same material so that the metal partition portion 211 and the signal line 25 can be prepared in the same process, thereby shortening the process time.

Figure 8:
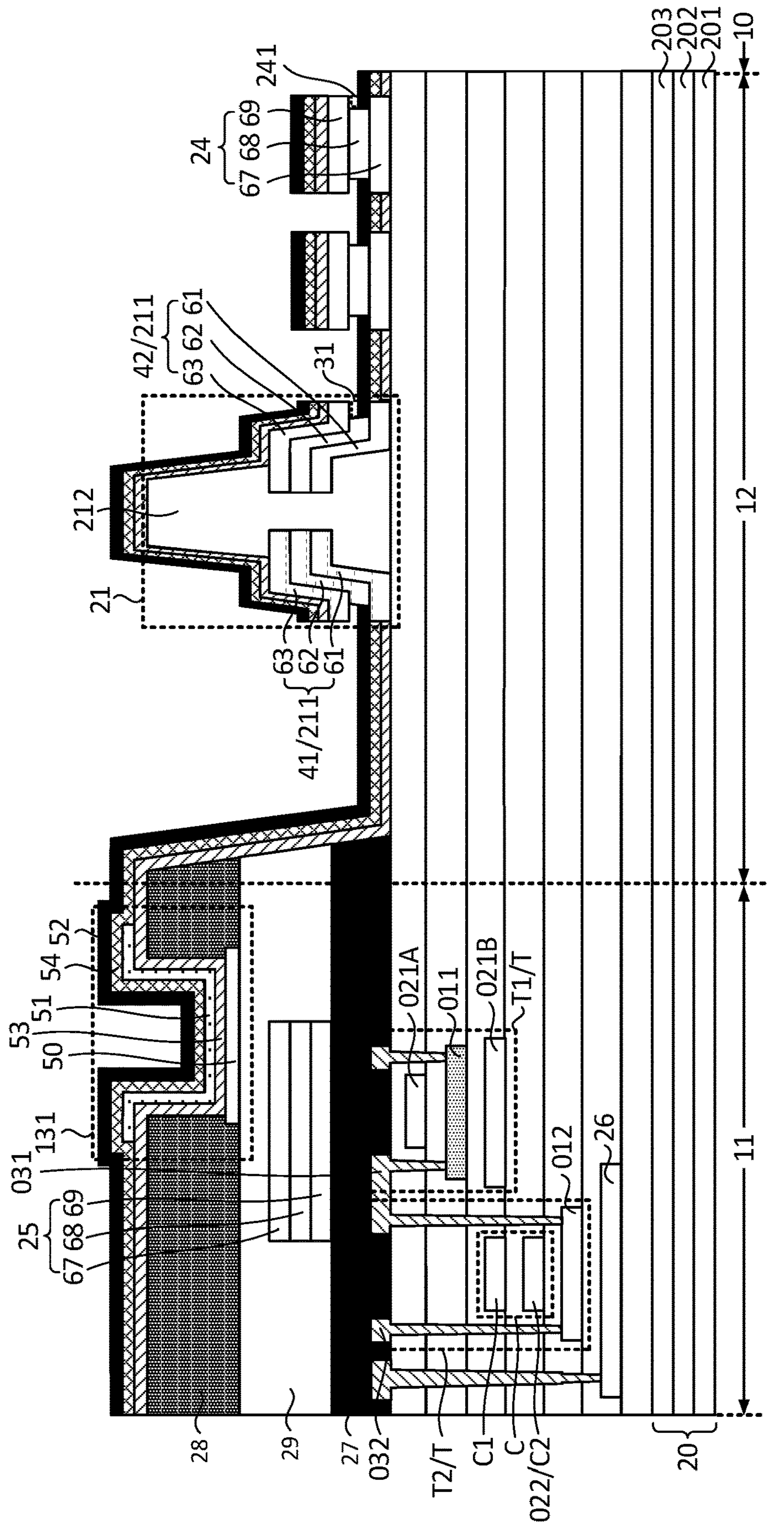
FIG. 8 is a sectional view of another display panel according to an embodiment of the present disclosure.

FIG. 8 is a sectional view of another display panel according to an embodiment of the present disclosure. As shown in FIG. 8, the signal line 25 may be a three-layer metal structure, the signal line 25 includes a seventh metal layer 67, an eighth metal layer 68, and a ninth metal layer 69 that are sequentially stacked.

Optionally, the seventh metal layer 67 and the ninth metal layer 69 may be titanium layers, the eighth metal layer 68 may be an aluminum layer, and the signal line 25 is a titanium/aluminum/titanium three-layer metal structure. The titanium/aluminum/titanium three-layer metal structure has a small square resistance, which can reduce the resistance of the signal line 25 and reduce the signal loss.

Further, the seventh metal layer 67 and the first metal layer 61 may be located in the same film layer, the eighth metal layer 68 and the second metal layer 62 may be located in the same film layer, and the ninth metal layer 69 and the third metal layer 63 may be located in the same film layer to reduce the number of metal film layers to be set, thereby achieving the purposes of reducing production costs and reducing a display panel thickness.

Moreover, the seventh metal layer 67 and the first metal layer 61 may be made of the same material, the eighth metal layer 68 and the second metal layer 62 may be made of the same material, and the ninth metal layer 69 and the third metal layer 63 may be made of the same material so that the seventh metal layer 67 and the first metal layer 61, the eighth metal layer 68 and the second metal layer 62, and the ninth metal layer 69 and the third metal layer 63 can be prepared in the same process, respectively, thereby shortening the process time.

With continued reference to FIGS. 7 and 8, optionally, the signal line 25 is a data signal line, and the signal line 25 is disposed on one side of the thin-film transistor T facing away from the base substrate 20 so that the metal partition portion 211 and the signal line 25 are disposed in the same film layer, which can make the film layer position of the metal partition portion 211 farther away from the base substrate 20. In this manner, the height of the partition retaining wall 21 can be increased to block the organic encapsulation layer in the thin-film encapsulation layer and prevent the organic encapsulation layer from overflowing into the aperture region, thereby preventing moisture and oxygen in the external environment from laterally corroding the display panel through the organic encapsulation layer.

With continued reference to FIGS. 7 and 8, optionally, the thin-film transistor T in the pixel driving circuit includes a first transistor T1. The first transistor T1 may be an oxide semiconductor transistor, such as an N-type indium gallium zinc oxide (IGZO) transistor, so that the first transistor T1 has the advantages of low mobility and small leakage current, thereby facilitating the solving of the leakage current problem during low-frequency driving and improving the stability of the low-frequency driving of the pixel driving circuit.

The first transistor T1 may include a second gate layer 021B, a first active layer 011, a first gate layer 021A, and a first source-drain electrode layer 031 connected to the first active layer 011 that are stacked. The first transistor T1 is a double-gate transistor, and the double-gate transistor has the characteristic of a small leakage current, thereby effectively solving the leakage current problem during low-frequency driving; in this manner, the pixel driving circuit is suitable for low-frequency driving, thereby facilitating the reduction of the power consumption of the display panel.

Moreover, since the size of the oxide semiconductor transistor is generally large, by setting the first transistor T1 as a double-gate transistor, the size of the first transistor T1 can be reduced, thereby facilitating an increase in the pixel density.

With continued reference to FIGS. 7 and 8, optionally, the thin-film transistor T in the pixel driving circuit further includes a second transistor T2. The second transistor T2 may be a P-type low temperature poly-silicon (LTPS) thin-film transistor (P-type transistor), and the LTPS transistor has the advantages of small size and good stability.

With continued reference to FIGS. 7 and 8, for example, the thin-film transistor T in the pixel driving circuit may include both a first transistor T1 and a second transistor T2, where the first transistor T1 is an IGZO transistor and the second transistor T2 is an LTPS transistor.

The second transistor T2 includes a second active layer 012, a third gate layer 022, and a second source-leakage layer 032 that are stacked on one side of the base substrate 20, and the material of the second active layer 012 is polysilicon. The third gate layer 022 may be disposed on one side of the second active layer 012 away from the base substrate 20. That is, the LTPS transistor is a top-gate structure, which is not limited here.

With continued reference to FIGS. 7 and 8, optionally, the pixel driving circuit further includes a storage capacitor C. The storage capacitor C includes a first plate C1 and a second plate C2, the first plate C1 is disposed on one side of the second plate C2 facing away from the base substrate 20.

Optionally, the second plate C2 and the third gate layer 022 may share the same metal film layer structure to reduce the number of metal film layers to be set, thereby achieving the purposes of reducing production costs and reducing a display panel thickness.

Further, as shown in FIGS. 7 and 8, the second gate layer 021B of the first transistor T1 and the first plate C1 of the storage capacitor C may be located in the same film layer, so that one metal film layer can be reduced, thereby achieving the purposes of reducing production costs and reducing the thickness of the display panel. Moreover, the second gate layer 021B of the first transistor T1 and the first plate C1 of the storage capacitor C may be made of the same material so that the second gate layer 021B of the first transistor T1 and the first plate C1 of the storage capacitor C may be prepared in the same process to shorten the process time, which is not limited here.

With continued reference to FIGS. 7 and 8, optionally, the display panel further includes a light-shielding metal layer 26. The light-shielding metal layer 26 is disposed on one side of the first active layer 011 of the first transistor T1 adjacent to the base substrate 20. In the thickness direction of the base substrate 20, the light-shielding metal layer 26 is at least partially overlapped with the first active layer 011, and the light-shielding metal layer 26 is used for shielding the channels formed by the first active layer 011 to prevent external ambient light from irradiating the first active layer 011 so that the first active layer 011 can be prevented from affecting the off-state current of the first transistor T1 due to being exposed to light.

Further, in the thickness direction of the base substrate 20, the light-shielding metal layer 26 may cover the first active layer 011 to avoid adverse effects of light on the first transistor T1, which is not limited here.

It is to be noted that the display panel may further include other film layer structures. For example, as shown in FIGS. 2 to 8, the display panel further includes a first planarization layer 27 and a pixel defining layer 28. The first planarization layer 27 is disposed on one side of the thin-film transistor T facing away from the base substrate 20, and the pixel defining layer 28 is disposed on one side of the first planarization layer 27 facing away from the base substrate 20. The pixel defining layer 28 includes a pixel aperture, and the emission layer 51 is connected to the anode layer 50 through the pixel aperture, which is not limited here.

In addition, insulating layers are correspondingly disposed between the metal film layers, and the embodiments of the present disclosure do not make specific limitations in this regard.

Figure 9:
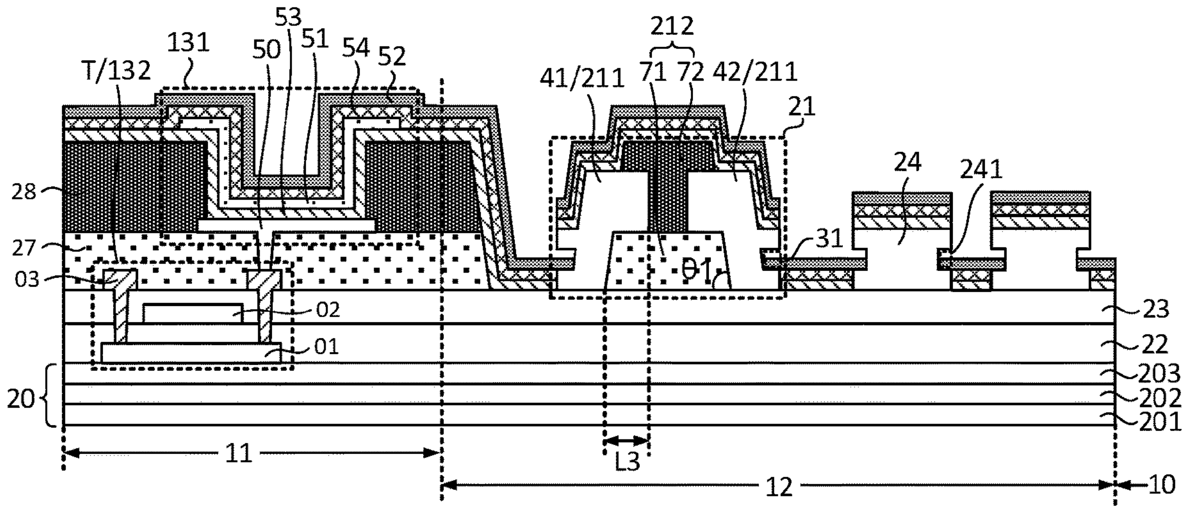
FIG. 9 is a sectional view of another display panel according to an embodiment of the present disclosure.

FIG. 9 is a sectional view of another display panel according to an embodiment of the present disclosure. As shown in FIG. 9, optionally, the insulating retaining wall portion 212 includes a first organic layer 71 and a second organic layer 72; in the thickness direction of the base substrate 20, the first organic layer 71 is located on one side of the metal partition portion 211 adjacent to the base substrate 20, and the second organic layer 72 is located on one side of the mental partition portion 211 facing away from the base substrate 20.

Specifically, when the partition retaining wall 21 is prepared, the first organic layer 71 is prepared first, then the metal partition portion 211 is prepared on one side of the first organic layer 71 facing away from the base substrate 20, and finally, the second organic layer 72 is prepared on one side of the metal partition portion 211 facing away from the base substrate 20, where the first organic layer 71 and the second organic layer 72 form the insulating retaining wall portion 212, and the metal partition portion 211 may be embedded in the insulating retaining wall portion 211 so that the metal partition portion 211 and the insulating retaining wall portion 212 can be prevented from being lifted off from each other.

Moreover, in the laser lift-off (LLO) process, that is, in a process of lifting off a rigid substrate by the laser lift-off technology, the laser tends to cause the emission layer 51 in the isolating region 12 to vaporize, causing lifting off of the film layers and affecting the structural stability of the display panel. In this embodiment, the metal partition portion 211 is made of an opaque metal material, and when the metal partition portion 211 and the insulating retaining wall portion 212 are combined to form the partition retaining wall 21, the light transmittance rate of the partition retaining wall 21 can be reduced so that when the rigid substrate is lifted off by LLO, the damage caused by laser to the region where the partition retaining wall 21 is disposed can be reduced, thereby improving the structural stability of the display panel.

In addition, since dense metal wires are disposed in the display region 11 with a low light transmittance rate, by combining the opaque metal partition portion 211 and the insulating retaining wall portion 212 to form the partition retaining wall 21, the light transmittance rate of the partition retaining wall 21 is reduced, and the light transmittance rate of the isolating region 12 can be made close to the light transmittance rate of the display region 11 so that the optimal energy setting of the laser during the laser lift-off (LLO) process can take into account both the display region 11 and the isolating region 12, thereby facilitating to the lifting off of the rigid substrate.

With continued reference to FIG. 9, optionally, the first organic layer 71 and the first planarization layer 27 are located in the same film layer, so that one film layer can be reduced, thereby achieving the purposes of reducing production costs and reducing the thickness of the display panel. Moreover, the first organic layer 71 and the first planarization layer 27 may be made of the same material so that the first organic layer 71 and the first planarization layer 27 may be prepared in the same process, thereby shortening the process time.

Optionally, as shown in FIG. 9, the second organic layer 72 and the pixel defining layer 28 are located in the same film layer, so that one film layer can be reduced, thereby achieving the purposes of reducing production costs and reducing the thickness of the display panel. Moreover, the second organic layer 72 and the pixel defining layer 28 may be made of the same material so that the second organic layer 72 and the pixel defining layer 28 may be prepared in the same process, thereby shortening the process time.

With continued reference to FIG. 9, optionally, the included angle between the sidewall of the first organic layer 71 and the bottom surface of the first organic layer 71 is $\theta 1$, where $50° \leq \theta 1 \leq 80°$.

As shown in FIG. 9, by setting the included angle $\theta 1$ between the sidewall of the first organic layer 71 and the bottom surface of the first organic layer 71 to satisfy $50° \leq \theta 1 \leq 80°$, when the metal partition portion 211 is prepared on the first organic layer 71, the metal partition portion 211 can cover the sidewall of the first organic layer 71 so that the metal partition portion 211 is adhered to the first organic layer 71, thereby reducing the risk of lifting off between the first organic layer 71 and the metal partition portion 211.

With continued reference to FIG. 9, optionally, in the thickness direction of the base substrate 20, the metal partition portion 211 covers at least part of the first organic layer 71.

As shown in FIG. 9, by setting the metal partition portion 211 to cover at least part of the first organic layer 71, the adhesiveness between the metal partition portion 211 and the first organic layer 71 can be improved, thereby reducing the risk of lifting off between the first organic layer 71 and the metal partition portion 211.

With continued reference to FIG. 9, optionally, in the direction in which the display region 11 points to the aperture region 10, the length of the overlapping portion between the first organic layer 71 and the metal partition portion 211 in the thickness direction of the base substrate 20 is L3, where $10\ \mu m \leq L3 \leq 20\ \mu m$.

By setting the length L3 of the overlapping portion between the first organic layer 71 and the metal partition portion 211 in the direction in which the display region 11 points to the aperture region 10 to satisfy $10\ \mu m \leq L3 \leq 20\ \mu m$, in one aspect, the adhesive area between the first organic layer 71 and the metal partition portion 211 is not too small to avoid the increase in risk of lifting off between the first organic layer 71 and the metal partition portion 211; in another aspect, the adhesive area between the first organic layer 71 and the metal partition portion 211 is also not too large to avoid the spacing between the first metal partition portion 41 and the second metal partition portion 42 being small, thereby preventing the reduction of the insulating property between the first metal partition portion 41 and the second metal partition portion 42 and preventing the partition effect on the cathode layer 52 from being affected.

With continued reference to FIG. 9, optionally, the vertical projection of the first organic layer 71 on the base substrate 20 covers the vertical projection of the second organic layer 72 on the base substrate 20.

As shown in FIG. 9, by setting the first organic layer 71 to cover the second organic layer 72 in the thickness direction of the base substrate 20, the second organic layer 72 is prevented from covering the first recess structure 31 on the metal partition portion 211 due to process errors, and the separation effect on the cathode layer 52 is prevented from being affected.

Further, the area of the vertical projection of the second organic layer 72 on the base substrate 20 may be less than the area of the vertical projection of the first organic layer 71 on the base substrate 20 to ensure that the second organic layer 72 is not in contact with the first recess structure 31 on the metal partition portion 211, thereby ensuring the partition effect of the first recess structure 31 on the cathode layer 52.

Figure 10:
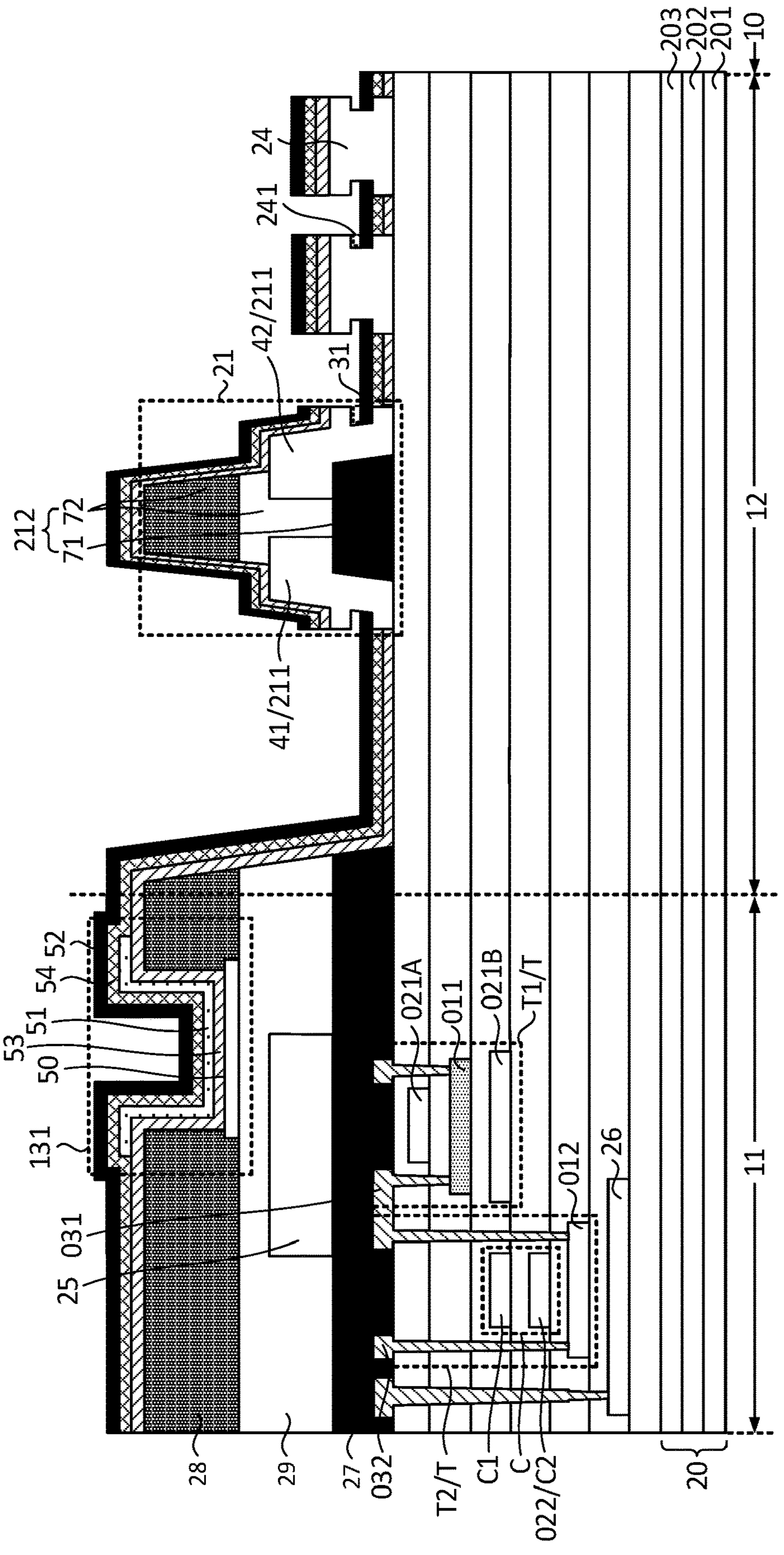
FIG. 10 is a sectional view of another display panel according to an embodiment of the present disclosure.

FIG. 10 is a sectional view of another display panel according to an embodiment of the present disclosure. As shown in FIG. 10, optionally, the display panel further includes a first planarization layer 27, a second planarization layer 29 located on one side of the first planarization layer 27 facing away from the base substrate 20, and a pixel defining layer 28 located on one side of the second planarization layer 29 facing away from the base substrate 20. The first organic layer 71 and the first planarization layer 27 are located in the same film layer. The second organic layer 72 and the second planarization layer 29 are located in the same film layer, the second organic layer 72 and the pixel defining layer 28 are located in the same film layer, or the second organic layer 72 is located in the same layer as the second planarization layer 29 and the pixel defining layer 28.

Specifically, as shown in FIGS. 7, 8, and 10, the display panel further includes a second planarization layer 29. In the thickness direction of the base substrate 20, the second planarization layer 29 is disposed between the signal line 25 and the anode layer 50 for isolating the signal line 25 and the anode layer 50 to avoid mutual interference of the signals on the signal line 25 and the anode layer 50.

In this embodiment, as shown in FIG. 10, the first organic layer 71 and the first planarization layer 27 are located in the same film layer, so that one film layer can be reduced, thereby achieving the purposes of reducing production costs and reducing the thickness of the display panel. Moreover, the first organic layer 71 and the first planarization layer 27 may be made of the same material so that the first organic layer 71 and the first planarization layer 27 may be prepared in the same process, thereby shortening the process time.

With continued reference to FIG. 10, the second organic layer 72 may include a two-layer film structure, where one layer in the two-layer film structure and the second planarization layer 29 are located in the same film layer, and the other layer in the two-layer film structure and the pixel defining layer 28 are located in the same film layer so that the number of film layers to be set can be reduced, thereby achieving the purposes of reducing production costs and reducing the thickness of the display panel. Moreover, the second organic layer 72, the second planarization layer 29, and the pixel defining layer 28 may be prepared in the same process, thereby shortening the process time.

The two-layer film structure of the second organic layer 72 can increase the height of the partition retaining wall 21 to block the organic encapsulation layer in the thin-film encapsulation layer and prevent the organic encapsulation layer from overflowing into the aperture region 10, thereby preventing moisture and oxygen in the external environment from laterally corroding the display panel through the organic encapsulation layer.

It is to be noted that, in other embodiments, the second organic layer 72 may also be a single-layer film structure, and the second organic layer 72 may be located in the same film layer as the second planarization layer 29 or the pixel defining layer 28 so that the number of film layers to be set can be reduced, thereby achieving the purposes of reducing production costs and reducing the thickness of the display panel. Moreover, the second organic layer 72 may be prepared in the same process as the second planarization layer 29 or the pixel defining layer 28 to shorten the process time, and the embodiments of the present disclosure do not make specific limitations in this regard.

With continued reference to FIG. 10, optionally, the display panel provided by this embodiment of the present disclosure further includes a signal line 25. The signal line 25 is located between the first planarization layer 27 and the second planarization layer 29, and the metal partition portion 211 and the signal line 25 are located in the same film layer.

Specifically, as shown in FIG. 10, by setting the metal partition portion 211 and the signal line 25 between the first planarization layer 27 and the second planarization layer 29 to be located in the same film layer, the number of film layers to be set can be reduced, thereby achieving the purposes of reducing production costs and reducing the thickness of the display panel. Moreover, the metal partition portion 211 and the signal line 25 may be made of the same material so that the metal partition portion 211 and the signal line 25 can be prepared in the same process, thereby shortening the process time.

Further, by setting the film layer position of the metal partition portion 211 to be located between the first planarization layer 27 and the second planarization layer 29, the film layer position of the metal partition portion 211 can be farther away from the base substrate 20, and the height of the partition retaining wall 21 can be increased to block the organic encapsulation layer in the thin-film encapsulation layer and prevent the organic encapsulation layer from overflowing into the aperture region 10, thereby preventing moisture and oxygen in the external environment from laterally corroding the display panel through the organic encapsulation layer.

The signal line 25 may be a data signal line, which is not limited here.

Based on the same inventive concept, the embodiments of the present disclosure further provide a method for preparing a display panel for preparing any display panel provided in the embodiments described above. Structures and terms that are the same as or that correspond to the embodiments described above are not re-explained here.

FIG. 11 is a flowchart of a method for preparing a display panel according to an embodiment of the present disclosure. As shown in FIG. 11, the preparation method includes steps S11 and S12 described below.

In S11, a partition retaining wall is prepared on one side of a base subtract in an isolating region, where the partition retaining wall includes a metal partition portion and an insulating retaining wall portion; in a direction in which a display region points to an aperture region, a sidewall on one side of the metal partition portion facing away from the insulating retaining wall portion includes a first recess structure, and the first recess structure is recessed towards one side of the insulating retaining wall portion; the metal partition portion includes a first metal partition portion and a second metal partition portion; in the direction in which the display region points to the aperture region, the insulating retaining wall portion is located between the first metal partition portion and the second metal partition portion, and the first metal partition portion and the second metal partition portion are insulated from each other.

Specifically, as shown in FIGS. 1 and 2, the display panel includes an aperture region 10, a display region 11 surrounding the aperture region 10, and an isolating region 12 located between the display region 11 and the aperture region 10.

The aperture region 10 is used for accommodating a photosensitive element, and the photosensitive element may be, but is not limited to, a camera, a light sensor, a distance sensor, a depth sensor, an iris recognition sensor or an infrared sensor.

Further, as shown in FIG. 2, a partition retaining wall 21 is disposed on one side of a base subtract 20 in the isolating region 12, the partition retaining wall 21 includes a metal partition portion 211, and the metal partition portion 211 includes a first metal partition portion 41 and a second metal partition portion 42 arranged in the direction in which the display region 11 points to the aperture region 10.

In the direction in which the display region 11 points to the aperture region 10, a first recess structure 31 is disposed on a sidewall on one side of the first metal partition portion 41 facing away from the second metal partition portion 42. Similarly, in the direction in which the display region 11 points to the aperture region 10, a first recess structure 31 is also disposed on a sidewall on one side of the second metal partition portion 42 facing away from the first metal partition portion 41.

Further, in the direction in which the display region 11 points to the aperture region 10, an insulating retaining wall portion 212 is disposed between the first metal partition portion 41 and the second metal partition portion 42, and the insulating retaining wall portion 212 is used for insulating the first metal partition portion 41 and the second metal partition portion 42 from each other.

In S12, a cathode layer is prepared on one side of the partition retaining wall facing away from the base substrate, where the cathode layer extends from the display region to the isolating region, and the cathode layer is separated at the first recess structure.

Specifically, as shown in FIG. 2, when the cathode layer 52 is prepared on one side of the partition retaining wall 21 facing away from the base substrate 20, the cathode layer 52 is not able to cover the first recess structure 31 on the second metal partition portion 42, thereby allowing the cathode layer 52 to be separated at the position of the first recess structure 31 on the second metal partition portion 42. Moreover, the cathode layer 52 is also not able to cover the first recess structure 31 on the first metal partition portion 41, thereby allowing the cathode layer 52 to be separated at the position of the first recess structure 31 on the first metal partition portion 41.

Further, since the insulating retaining wall portion 212 can cut off the electrical connection between the first metal partition portion 41 and the second metal partition portion 42, the cathode layer 52 on both sides of the partition retaining wall 21 will not form a conductive path through the first metal partition portion 41 and the second metal partition portion 42. Even if the static electricity enters through the cathode layer 52 at the cut section in the aperture region 10, the transmission path is cut off at the partition retaining wall 21 in the isolating region 12 so that the static electricity cannot enter the display region 11, thereby preventing static electricity from causing electrical interference with the sub-pixels 13 in the display region 11 and solving the problem of the abnormal display in the display region 11 around the aperture region 10. Moreover, the power signal transmitted on the partition retaining wall 21 cannot be transmitted to the cut section of the aperture region 10 through the isolating region 12, thereby solving the problem of the formation of dark spots due to electrochemical corrosion at the cut section in the aperture region 10 and improving the display quality.

Optionally, the step where a partition retaining wall is prepared on one side of a base subtract in an isolating region includes the following steps.

A first organic layer is prepared on one side of the base subtract.

The metal partition portion is prepared on one side of the first organic layer facing away from the base subtract.

A second organic layer is prepared on one side of the partition retaining wall facing away from the base substrate to form the partition retaining wall, where the first organic layer and the second organic layer form the insulating retaining wall portion.

Specifically, as shown in FIG. 9, a first organic layer 71 is prepared on one side of the base substrate 20, then the metal partition portion 211 is prepared on one side of the first organic layer 71 facing away from the base substrate 20, and finally, a second organic layer 72 is prepared on one side of the metal partition portion 211 facing away from the base substrate 20, where the first organic layer 71 and the second organic layer 72 form the insulating retaining wall portion 212, and the metal partition portion 211 may be embedded in the insulating retaining wall portion 211 so that the metal partition portion 211 and the insulating retaining wall portion 212 can be prevented from being lifted off from each other.

With continued reference to FIG. 9, optionally, the first organic layer 71 and the first planarization layer 27 may be prepared in the same process, thereby shortening the process time.

In addition, the second organic layer 72 and the pixel defining layer 28 may be prepared in the same process, thereby shortening the process time.

Optionally, the step where the metal partition portion is prepared on one side of the first organic layer facing away from the base subtract includes the following steps.

A first metal layer, a second metal layer, and a third metal layer are sequentially prepared on one side of the first organic layer facing away from the base subtract.

A sidewall of the second metal layer is etched to form the metal partition portion.

FIGS. 12 and 13 are structural diagrams of the flow of a method for preparing a display panel according to an embodiment of the present disclosure. As shown in FIGS. 12 and 13, a first metal layer 61, a second metal layer 62, and a third metal layer 63 are sequentially prepared on one side of the first organic layer 71 facing away from the base subtract 20. Then, during the etching of the sidewall of the second metal layer 62, since the etching rate of both the first metal layer 61 and the third metal layer 63 is much smaller than the etching rate of the second metal layer 62, the second metal layer 62 located in the intermediate layer is preferentially etched, and the sidewall of the second metal layer 62 is recessed inwardly to form the first recess structure 31 and finally form the metal partition portion 211.

Optionally, the first metal layer 61 and the third metal layer 63 may be titanium layers, and the second metal layer 62 may be an aluminum layer. In this manner, during the preparation of the metal partition portion 211, when the first metal layer 61, the second metal layer 62, and the third metal layer 63 are etched, since the etching rate of titanium is much smaller than the etching rate of aluminum, the aluminum layer located in the intermediate layer is preferentially etched so that the sidewall of the aluminum layer is preferentially etched to form a notch that is recessed inwardly to form the first recess structure 31.

Optionally, before the sidewall of the second metal layer is etched, the preparation method further includes the following step.

An anode metal layer is prepared on one side of the third metal layer facing away from the base substrate.

The step where the sidewall of the second metal layer is etched includes the following step.

The sidewall of the second metal layer is etched while the anode metal layer is etched.

Figure 14:
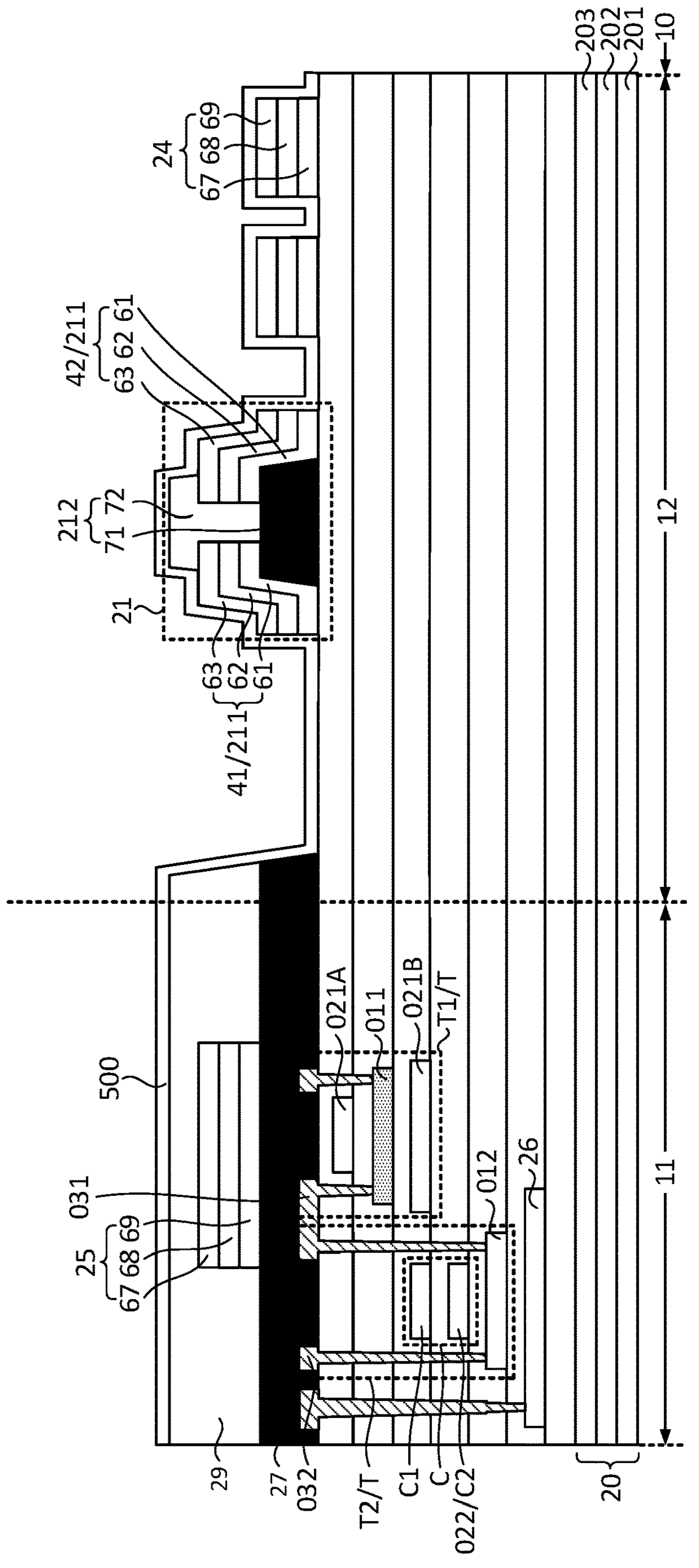
FIGS. 14 and 15 are structural diagrams of the flow of another method for preparing a display panel according to an embodiment of the present disclosure.
Figure 15:
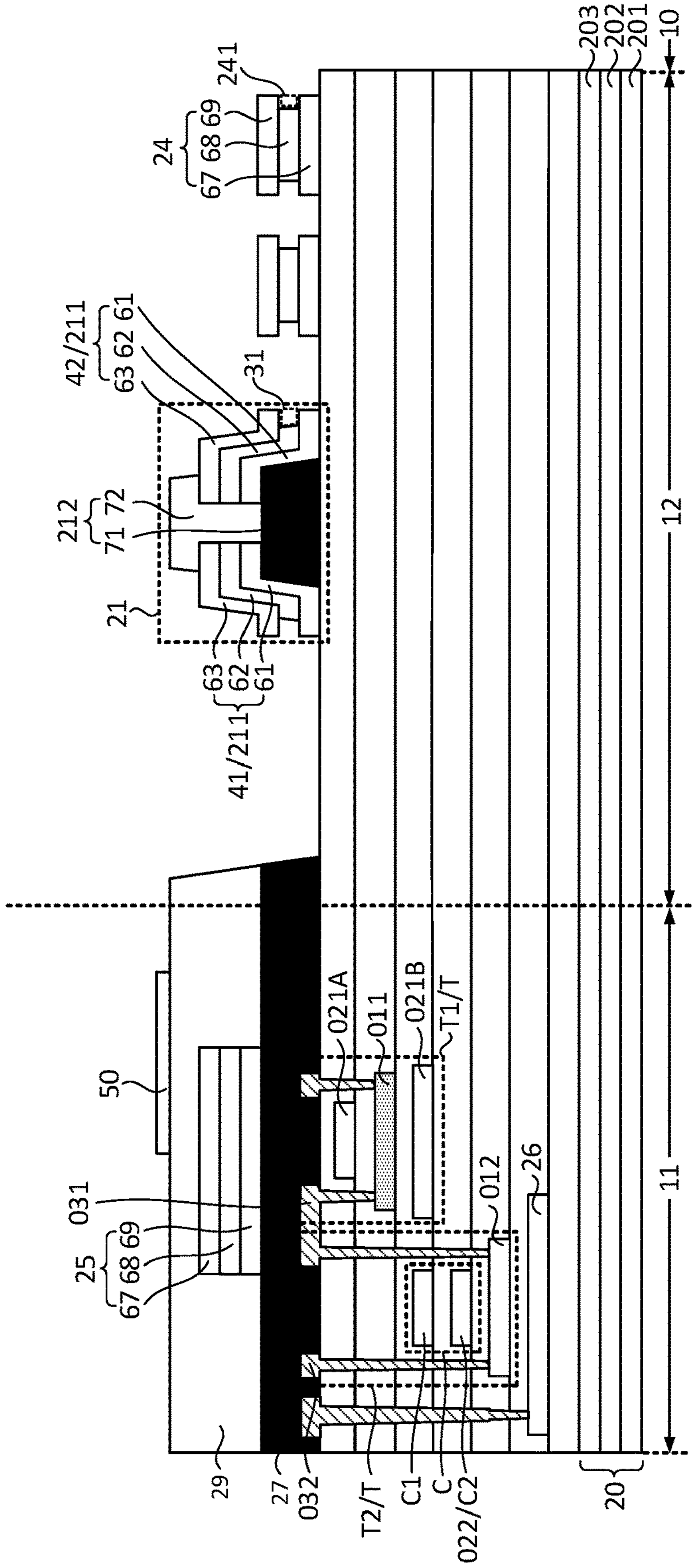

FIGS. 14 and 15 are structural diagrams of the flow of another method for preparing a display panel according to an embodiment of the present disclosure. As shown in FIGS. 14 and 15, after the preparation of the third metal layer 63 is completed, a whole layer of anode metal layer 500 may be prepared on one side of the second planarization layer 29 facing away from the base substrate 20, and the sidewall of the second metal layer 62 is etched to form the first recess structure 31 while the anode metal layer 500 is patterned to form the anode layer 50 so that the anode layer 50 and the first recess structure 31 are formed through the same mask, thereby reducing the number of masks used, reducing manufacturing costs, and shortening the process time.

Further, as shown in FIGS. 14 and 15, the sidewall of the eighth metal layer 68 is also etched to form the second recess structure 241 while the anode metal layer 500 is patterned to form the anode layer 50 so that the second recess structure 241 on the metal isolating column 24 and the anode layer 50 are also formed through the same mask, thereby further reducing the number of masks used, reducing manufacturing costs, and shortening the process time.

Optionally, after the cathode layer is prepared on one side of the partition retaining wall facing away from the base substrate, the preparation method further includes the following step.

A thin-film encapsulation layer is prepared on one side of the cathode layer facing away from the base subtract, where the thin-film encapsulation layer includes an organic encapsulation layer, and the organic encapsulation layer is located on one side of the partition retaining wall facing away from the aperture region.

Further, as shown in FIG. 3, a thin-film encapsulation layer 60 is prepared on one side of the cathode layer 52 facing away from the base subtract 20, and the partition retaining wall 21 can block the organic encapsulation layer 601 in the thin-film encapsulation layer 60 from extending to the side of the partition retaining wall 21 away from the aperture region 10, so as to prevent the organic encapsulation layer 601 from overflowing into the aperture region 10, thereby preventing moisture and oxygen in the external environment from laterally corroding the display panel through the organic encapsulation layer 601.

It is to be noted that for other structures in FIGS. 12 to 15, reference may be made to any of the embodiments described above, and the details are not repeated here.

Figure 16:
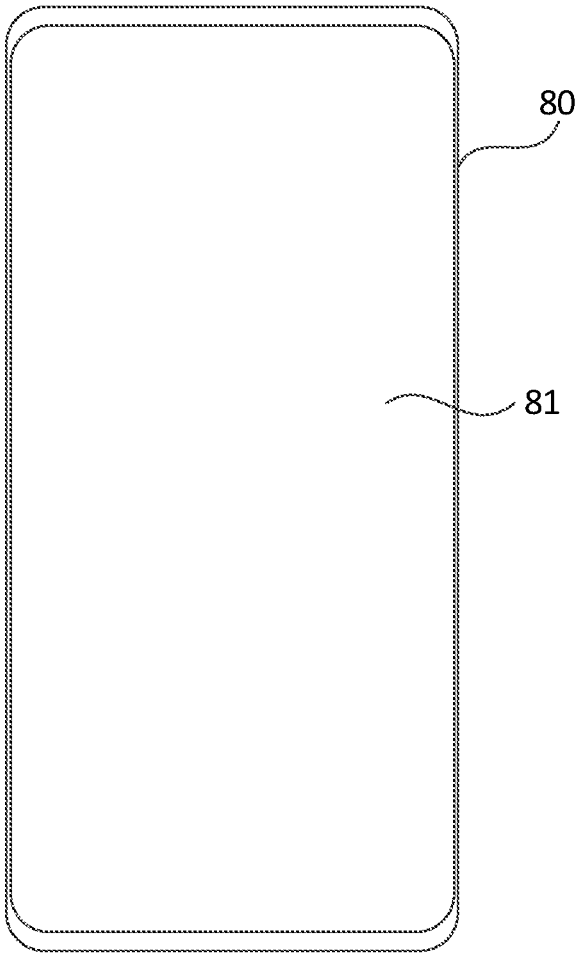
FIG. 16 is a structural diagram of a display device according to an embodiment of the present disclosure.

Based on the same inventive concept, the embodiments of the present disclosure further provide a display device. FIG. 16 is a structural diagram of a display device according to an embodiment of the present disclosure. As shown in FIG. 16, the display device 80 includes a display panel 81 described in any of the embodiments of the present disclosure, and thus, the display device 80 provided by this embodiment of the present disclosure has the effects of the solution of any of the embodiments described above. Structures and terms that are the same as or that correspond to the embodiments described above are not re-explained here.

The display device 80 provided by this embodiment of the present disclosure may be a cellphone shown in FIG. 16 or may be any electronic product having a display function. The electronic product includes, but is not limited to, a television set, a laptop, a desktop display, a tablet, a digital camera, a smart bracelet, smart glasses, an in-vehicle display, a medical device, an industrial control device or a touch interactive terminal, and the embodiments of the present disclosure do not make specific limitations in this regard.

It is to be understood that various forms of processes shown above may be adopted with steps reordered, added, or deleted. For example, the steps described in the present disclosure may be performed in parallel, sequentially, or in different sequences, as long as the desired results of the solutions of the present disclosure can be achieved, and no limitation is imposed herein.

The embodiments described above do not limit the scope of the present disclosure. It is to be understood by those skilled in the art that various modifications, combinations, sub-combinations, and substitutions may be performed according to design requirements and other factors. Any modifications, equivalent substitutions, improvements and the like made within the spirit and principle of the present disclosure are within the scope of the present disclosure.

What is claimed is:

1. A display panel, comprising an aperture region, a display region surrounding the aperture region, and an isolating region located between the display region and the aperture region; wherein the display panel further comprises a base substrate and a partition retaining wall located on one side of the base substrate, and the partition retaining wall is located in the isolating region;

the partition retaining wall comprises a metal partition portion and an insulating retaining wall portion; in a direction in which the display region points to the aperture region, a sidewall on one side of the metal partition portion facing away from the insulating retaining wall portion comprises a first recess structure, and the first recess structure is recessed towards one side of the insulating retaining wall portion;

the metal partition portion comprises a first metal partition portion and a second metal partition portion;

in the direction in which the display region points to the aperture region, the insulating retaining wall portion is located between the first metal partition portion and the second metal partition portion, and the first metal partition portion and the second metal partition portion are insulated from each other;

the display panel further comprises a cathode layer, and the cathode layer extends from the display region to the isolating region;

in a thickness direction of the base substrate, the cathode layer is located on one side of the partition retaining wall facing away from the base substrate, and the cathode layer is separated at the first recess structure.

2. The display panel according to claim 1, wherein the display panel further comprises a thin-film encapsulation layer, and in the thickness direction of the base substrate, the thin-film encapsulation layer is located on one side of the partition retaining wall facing away from the base substrate;

the thin-film encapsulation layer comprises an organic encapsulation layer, and the organic encapsulation layer is located on one side of the partition retaining wall facing away from the aperture region.

3. The display panel according to claim 1, wherein a height of the insulating retaining wall portion is H1, and a height of the metal partition portion is H2, wherein H1≥H2.

4. The display panel according to claim 1, wherein the metal partition portion comprises a first metal layer, a second metal layer, and a third metal layer, the third metal layer is located on one side of the first metal layer facing away from the base substrate, and the second metal layer is located between the first metal layer and the third metal layer;

a material of the first metal layer is the same as a material of the third metal layer, and the material of the first metal layer is different from a material of the second metal layer;

in the direction in which the display region points to the aperture region, a boundary on one side of the second metal layer facing away from the insulating retaining wall portion is a first boundary, a boundary on one side of the third metal layer facing away from the insulating retaining wall portion is a second boundary, and the first boundary is located on one side of the second boundary adjacent to the insulating retaining wall portion.

5. The display panel according to claim 1, wherein the isolating region further comprises at least one metal isolating column, and a sidewall of a metal isolating column of the at least one metal isolating column is recessed internally to form a second recess structure;

the metal partition portion and the at least one metal isolating column are located in a same film layer.

6. The display panel according to claim 1, wherein the isolating region comprises at least two metal isolating columns, and in the direction in which the display region points to the aperture region, a spacing between adjacent metal isolating columns of the at least two metal isolating columns is d1;

in the direction in which the display region points to the aperture region, a boundary on one side of the first metal partition portion facing away from the insulating retaining wall portion is a third boundary, a boundary on one side of the second metal partition portion facing away from the insulating retaining wall portion is a fourth boundary, and a distance between the third boundary and the fourth boundary is d2;

wherein d2≥d1.

7. The display panel according to claim 1, wherein in the direction in which the display region points to the aperture region, a boundary on one side of the first metal partition portion facing away from the insulating retaining wall portion is a third boundary, a boundary on one side of the second metal partition portion facing away from the insulating retaining wall portion is a fourth boundary, and a distance between the third boundary and the fourth boundary is d2;

wherein 30 μm≤d2≤50 μm.

8. The display panel according to claim 1, wherein the display panel further comprises a signal line, and the metal partition portion and the signal line are located in a same film layer.

9. The display panel according to claim 1, wherein the insulating retaining wall portion comprises a first organic layer and a second organic layer; in the thickness direction of the base substrate, the first organic layer is located on one side of the metal partition portion adjacent to the base substrate, and the second organic layer is located on one side of the metal partition portion facing away from the base substrate.

10. The display panel according to claim 9, wherein an included angle between a sidewall of the first organic layer and a bottom surface of the first organic layer is θ1, wherein 50°≤θ1≤80°.

11. The display panel according to claim 9, wherein in the thickness direction of the base substrate, the metal partition portion covers at least part of the first organic layer.

12. The display panel according to claim 9, wherein a vertical projection of the first organic layer on the base substrate covers a vertical projection of the second organic layer on the base substrate.

13. The display panel according to claim 9, wherein the display panel further comprises a first planarization layer, a second planarization layer located on one side of the first planarization layer facing away from the base substrate, and a pixel defining layer located on one side of the second planarization layer facing away from the base substrate;

the first organic layer and the first planarization layer are located in a same film layer;

the second organic layer and at least one of the second planarization layer and the pixel defining layer are located in a same film layer.

14. The display panel according to claim 13, wherein the display panel further comprises a signal line, the signal line is located between the first planarization layer and the second planarization layer, and the metal partition portion and the signal line are located in a same film layer.

15. A method for preparing a display panel, wherein the display panel comprises an aperture region, a display region surrounding the aperture region, and an isolating region located between the display region and the aperture region;

wherein the preparation method comprises:

preparing a partition retaining wall on one side of a base subtract in the isolating region; wherein the partition retaining wall comprises a metal partition portion and an insulating retaining wall portion; in a direction in which the display region points to the aperture region, a sidewall on one side of the metal partition portion facing away from the insulating retaining wall portion comprises a first recess structure, and the first recess structure is recessed towards one side of the insulating retaining wall portion; the metal partition portion comprises a first metal partition portion and a second metal partition portion; in the direction in which the display region points to the aperture region, the insulating retaining wall portion is located between the first metal partition portion and the second metal partition portion, and the first metal partition portion and the second metal partition portion are insulated from each other; and preparing a cathode layer on one side of the partition retaining wall facing away from the base substrate; wherein the cathode layer extends from the display region to the isolating region, and the cathode layer is separated at the first recess structure.

16. The preparation method according to claim 15, wherein preparing the partition retaining wall on one side of the base subtract in the isolating region comprises:

preparing a first organic layer on one side of the base subtract;

preparing the metal partition portion on one side of the first organic layer facing away from the base subtract; and preparing a second organic layer on one side of the partition retaining wall facing away from the base substrate to form the partition retaining wall, wherein the first organic layer and the second organic layer form the insulating retaining wall portion.

17. The preparation method according to claim 16, wherein preparing the metal partition portion on one side of the first organic layer facing away from the base subtract comprises:

preparing a first metal layer, a second metal layer, and a third metal layer sequentially on one side of the first organic layer facing away from the base subtract; and etching a sidewall of the second metal layer to form the metal partition portion.

18. The preparation method according to claim 17, wherein before etching the sidewall of the second metal layer, the preparation method further comprises:

preparing an anode metal layer on one side of the third metal layer facing away from the base substrate; and wherein etching the sidewall of the second metal layer comprises:

etching the sidewall of the second metal layer while etching the anode metal layer.

19. The preparation method according to claim 15, wherein after preparing the cathode layer on one side of the partition retaining wall facing away from the base substrate, the preparation method further comprises:

preparing a thin-film encapsulation layer on one side of the cathode layer facing away from the base subtract, wherein the thin-film encapsulation layer comprises an organic encapsulation layer, and the organic encapsulation layer is located on one side of the partition retaining wall facing away from the aperture region.

20. A display device, comprising a display panel, the display panel comprises an aperture region, a display region surrounding the aperture region, and an isolating region located between the display region and the aperture region; wherein the display panel further comprises a base substrate and a partition retaining wall located on one side of the base substrate, and the partition retaining wall is located in the isolating region;

the partition retaining wall comprises a metal partition portion and an insulating retaining wall portion; in a direction in which the display region points to the aperture region, a sidewall on one side of the metal partition portion facing away from the insulating retaining wall portion comprises a first recess structure, and the first recess structure is recessed towards one side of the insulating retaining wall portion;

the metal partition portion comprises a first metal partition portion and a second metal partition portion;

in the direction in which the display region points to the aperture region, the insulating retaining wall portion is located between the first metal partition portion and the second metal partition portion, and the first metal partition portion and the second metal partition portion are insulated from each other;

the display panel further comprises a cathode layer, and the cathode layer extends from the display region to the isolating region; and in a thickness direction of the base substrate, the cathode layer is located on one side of the partition retaining wall facing away from the base substrate, and the cathode layer is separated at the first recess structure.

* * * * *